United States Patent
Shin et al.

(10) Patent No.: US 9,258,506 B2
(45) Date of Patent: Feb. 9, 2016

(54) COUNTER CIRCUIT, ANALOG-TO-DIGITAL CONVERTER, AND IMAGE SENSOR INCLUDING THE SAME AND METHOD OF CORRELATED DOUBLE SAMPLING

(71) Applicant: SAMSUNG ELECTRONICS CO., LTD., Suwon-si (KR)

(72) Inventors: Ji-Hun Shin, Seongnam-si (KR); Chang-Eun Kang, Seoul (KR); Won-Ho Choi, Suwon-si (KR); Dong-Hun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/335,309

(22) Filed: Jul. 18, 2014

(65) Prior Publication Data
US 2015/0028190 A1     Jan. 29, 2015

(30) Foreign Application Priority Data
Jul. 24, 2013 (KR) .................. 10-2013-0087131

(51) Int. Cl.
| | |
|---|---|
| *H04N 5/335* | (2011.01) |
| *H04N 5/378* | (2011.01) |
| *H03K 21/38* | (2006.01) |
| *H03K 23/66* | (2006.01) |
| *H03M 1/14* | (2006.01) |
| *H03M 1/12* | (2006.01) |
| *H03M 1/56* | (2006.01) |
| *H04N 5/357* | (2011.01) |
| *H04N 5/369* | (2011.01) |
| *H04N 5/3745* | (2011.01) |
| *H04N 13/02* | (2006.01) |

(52) U.S. Cl.
CPC ............... *H04N 5/378* (2013.01); *H03K 21/38* (2013.01); *H03K 23/667* (2013.01); *H03M 1/14* (2013.01); *H04N 13/0253* (2013.01); *H04N 13/0271* (2013.01); *H03M 1/123* (2013.01); *H03M 1/56* (2013.01); *H04N 5/3575* (2013.01); *H04N 5/3696* (2013.01); *H04N 5/3745* (2013.01); *H04N 13/0242* (2013.01); *H04N 2213/001* (2013.01)

(58) Field of Classification Search
CPC .......... H04N 5/335; H04N 5/378; H03M 1/12
USPC ............. 250/208.1, 214 R, 214 DC; 341/155, 341/156, 157, 164; 348/294, 303
See application file for complete search history.

(56) References Cited

U.S. PATENT DOCUMENTS

| | | | |
|---|---|---|---|
| 6,980,191 B2 | 12/2005 | Nakamura et al. | |
| 7,088,279 B2 | 8/2006 | Muramatsu et al. | |
| 7,230,558 B2 * | 6/2007 | Lim ..................... | H04N 5/3456 341/155 |

(Continued)

FOREIGN PATENT DOCUMENTS

JP     2011-244055 A     12/2011

*Primary Examiner* — Kevin Pyo
(74) *Attorney, Agent, or Firm* — Sughrue Mion, PLLC

(57) ABSTRACT

A counter circuit includes a first counter and a second counter. The first counter is configured to count a first counter clock signal which toggles with a first frequency to generate upper (N−M)-bit signals of N-bit counter output signals, in response to a first counting enable signal based on a first comparison signal during a coarse counting interval. N and M are natural numbers, N is greater than M, and M is greater than or equal to 3. The second counter is configured to count a second counter clock signal which toggles with a second frequency which is higher than the first frequency to generate lower M-bit signals of the N-bit counter output signals, in response to a second counting enable signal based on the first comparison signal and a second comparison signal during a fine counting interval which follows the coarse counting interval.

20 Claims, 26 Drawing Sheets

(56) References Cited

U.S. PATENT DOCUMENTS

| | | |
|---|---|---|
| 7,629,913 B2 | 12/2009 | Okumura |
| 8,354,630 B2 | 1/2013 | Hoshino |
| 9,106,860 B2 * | 8/2015 | Hagihara ............... H04N 5/378 |
| 2010/0225796 A1 | 9/2010 | Lim et al. |
| 2010/0271525 A1 | 10/2010 | Takahashi |
| 2011/0292261 A1 | 12/2011 | Hwang et al. |
| 2012/0113286 A1 | 5/2012 | Lim et al. |
| 2013/0015329 A1 | 1/2013 | Iwaki |
| 2013/0120622 A1 | 5/2013 | Hiraoka et al. |

* cited by examiner

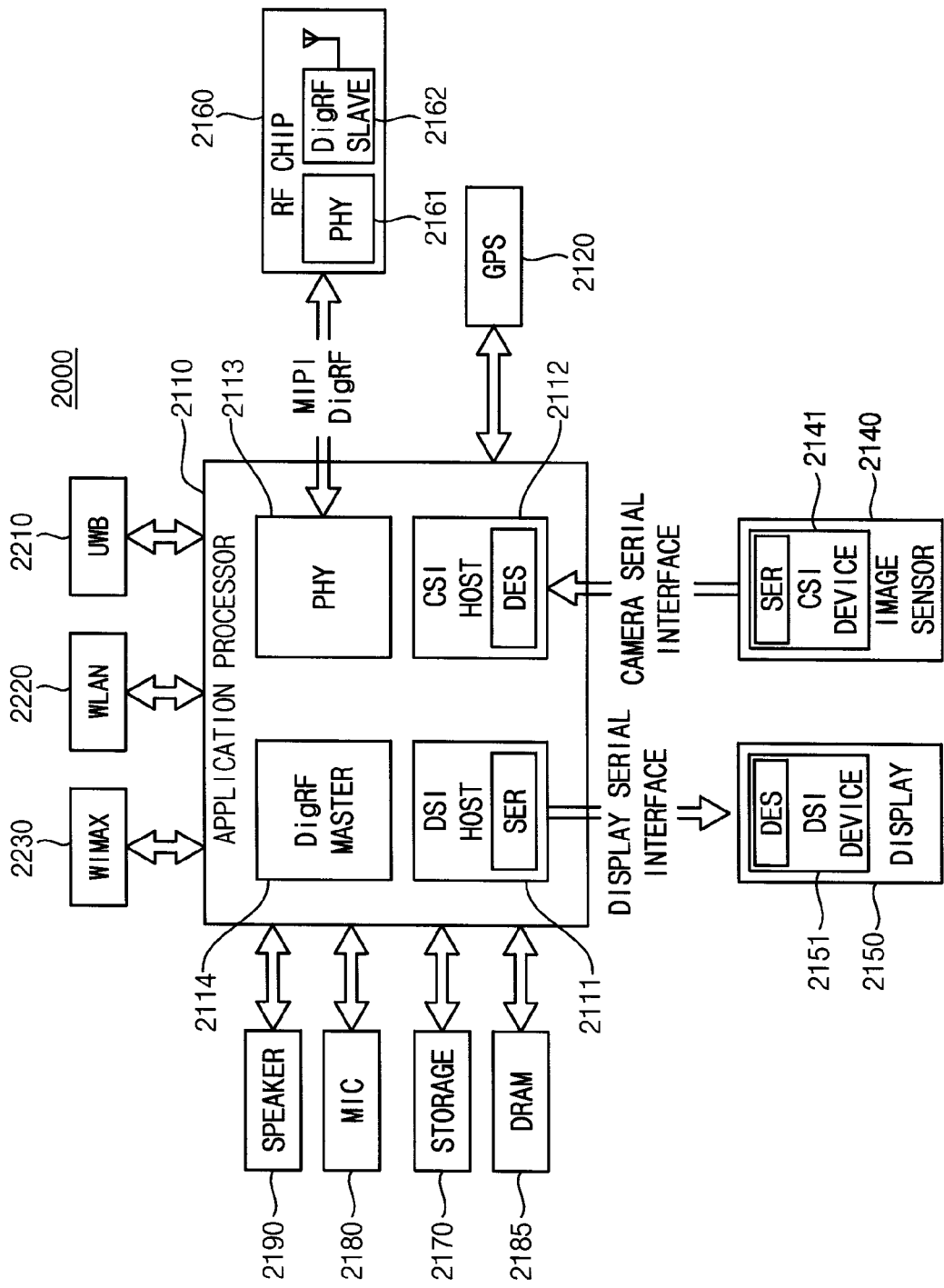

COUNTER CIRCUIT, ANALOG-TO-DIGITAL CONVERTER, AND IMAGE SENSOR INCLUDING THE SAME AND METHOD OF CORRELATED DOUBLE SAMPLING

CROSS-REFERENCE TO RELATED APPLICATION

This application claims priority from Korean Patent Application No. 10-2013-0087131, filed on Jul. 24, 2013 in the Korean Intellectual Property Office (KIPO), the disclosure of which is hereby incorporated by reference in its entirety.

BACKGROUND

1. Technical Field

Example embodiments relate to counters. In particular, exemplary embodiments relate to a counter circuit, an analog-to-digital converter, and an image sensor including the same and a method of correlated double sampling.

2. Description of the Related Art

Related art counter circuits may be used in various electronic devices for converting valid physical quantities, such as light intensity, sound intensity, and time to digital signals.

For example, image sensors are devices that capture images as detected optical signals, and generate corresponding digital data using inherent properties in semiconductor materials. The image sensors include an analog-to-digital converter (ADC) for converting analog signals from a pixel array to digital signals. The ADC may be implemented with a counter circuit that performs a counting operation using clock signals.

Operating speed and power consumption of the counter circuit may affect a performance of devices and systems including the counter circuit.

SUMMARY

Exemplary embodiments provide a counter circuit which is capable of reducing power consumption by reducing toggling numbers.

Exemplary embodiments provide an analog-to-digital converter (ADC) which is capable of reducing power consumption and which includes the counter circuit.

Exemplary embodiments provide an image sensor which is capable of reducing power consumption and which includes the counter circuit.

Exemplary embodiments provide a method of correlated double sampling, which uses the counter circuit.

According to an aspect of an exemplary embodiment, a counter circuit includes a first counter and a second counter. The first counter is configured to count a first counter clock signal which toggles with a first frequency to generate upper (N–M)-bit signals of N-bit counter output signals, in response to a first counting enable signal based on a first comparison signal during a coarse counting interval. N and M are natural numbers, N is greater than M, and M is greater than or equal to 3. The second counter is configured to count a second counter clock signal which toggles with a second frequency which is higher than the first frequency to generate lower M-bit signals of the N-bit counter output signals, in response to a second counting enable signal based on the first comparison signal and a second comparison signal during a fine counting interval which follows the coarse counting interval.

In an embodiment, the second frequency may be $2^{(M-1)}$ times or $2^{(M-2)}$ times higher than the first frequency.

In an embodiment, the first counter may include a switching unit which is configured to select one of a most significant bit (MSB) signal of the lower M-bit signals and the first counter clock signal in response to the first counting enable signal; and a first counting unit which is connected to the switching unit, wherein the first counting unit is configured to be disconnected from the second counter during the coarse counting interval and be connected to the second counter during the fine counting interval and generate the upper (N–M)-bit signals.

The first counting unit may include a plurality of D flip-flops which are configured to generate the upper (N–M)-bit signals, and the plurality of D flip-flops may be configured to be connected to one of the MSB signal and the first counter clock signal in response to the first counting enable signal. Each of the D flip-flops may include an inverted output terminal which is fed back to a data terminal; a clock terminal which receives an adjacent low bit signal; and an output terminal which provides each of the upper (N–M)-bit signals.

The first counting unit may be further configured to be connected to the second counter during the fine counting interval, and wherein the first counting unit may operate as a ripple counter.

In an embodiment, the second counter may be further configured to count the second counter clock signal during the fine counting interval, the fine counting interval is enabled in response to the coarse counting interval transitioning to a disabled state.

The second counter may include a latch which is configured to latch a least significant bit (LSB) of the upper M-bit signals in response to a latch control signal; an exclusive OR gate which is configured to perform an exclusive OR operation on an output of the latch and the second counter clock signal; a first D flip-flop which comprises a data terminal for receiving the output of the latch, a clock terminal for receiving the second counting enable signal, and an output terminal which provides the LSB; and a plurality of second D flip-flops which are configured to be connected to the first D flip-flop, the plurality of second D flip-flops are further configured to generate the (second through Mth)-bit signals. Each of the second D flip-flops may include an inverted output terminal which is fed back to a data terminal; a clock terminal which receives an adjacent low bit signal; and an output terminal which provides each of the (second through Mth)-bit signals.

In an embodiment, the counter circuit may further include a counter control logic which is configured to generate the first counting enable signal, the first counter clock signal, the second counting enable signal, and the second counter clock signal based on the first comparison signal, the second comparison signal, a first input clock signal having the first frequency and a second input clock signal having the second frequency, and the first comparison signal is inverted and delayed in comparison to the second comparison signal.

The counter control logic may include a first control section which is configured to generate the first counting enable signal and the first counter clock signal based on the first comparison signal and the first input clock signal; and a second control section which is configured to generate the second counting enable signal and the second counter clock signal based on the first comparison signal, the second comparison signal, the second input clock signal and the first counting enable signal.

The first control section may be further configured to generate the first counting enable signal such that the first counting enable signal is enabled during the coarse counting interval which includes a first interval and a second interval, the first interval may include a first time during which the first comparison signal is enabled, and the second interval may include at least one falling edge of the first counter clock signal which does not overlap with the first interval after the first comparison signal is disabled.

The second control section may be further configured to generate the second counting enable signal such that the second counting enable signal is enabled during the fine counting enable interval which includes an interval from a second time when the coarse counting interval is disabled to a third time when the second comparison signal is enabled.

In an embodiment, a bit number of the lower M-bit signals may be varied in response to at least one bit control signal.

The second counter may further include a multiplexer which is configured to provide one of a second most significant bit (MSB) of the lower M-bit signals and the first counter clock signal to a clock terminal of a D flip-flop which outputs the MSB of the lower M-bit signals.

In an embodiment, the upper (N−M)-bit signals may be toggling with a falling edge of the first counter clock signal and the lower M-bit signals may be toggling with a falling edge of the second counter clock signal.

According to an aspect of an exemplary embodiment, an analog-to-digital converter (ADC) includes the counter circuit; and a comparator. The comparator is configured to compare an analog signal and a reference signal to generate a first comparison signal, and the analog signal represents physical quantity. The counter circuit is configured to generate a digital signal which corresponds with the analog signal based on a first input clock signal and a second input clock signal.

In an embodiment, the counter circuit may further include a counter control logic which is configured to generate the first counting enable signal, the first counter clock signal, the second counting enable signal, and the second counter clock signal based on the first comparison signal, the second comparison signal, the first input clock signal having the first frequency, and the second input clock signal having the second frequency. The first comparison signal may be inverted and delayed in comparison to the second comparison signal.

In an embodiment, the first counter may include a switching unit which is configured to select one of a most significant bit (MSB) signal of the lower M-bit signals and the first counter clock signal in response to the first counting enable signal; and a first counting unit which is connected to the switching unit, wherein the first counting unit is configured to be disconnected from the second counter during the coarse counting interval, be connected to the second counter during the fine counting interval, and generate the upper (N−M)-bit signals.

In an embodiment, the counter may be configured to perform a counting operation at least twice per cycle period of the first counter clock signal and the second counter clock signal, and the second frequency may be $2^{(M-1)}$ times or $2^{(M-2)}$ times higher than the first frequency.

According to an aspect of an exemplary embodiment, an image sensor includes a sensing unit, an analog-to-digital converter (ADC) and a control unit. The sensing unit is configured to sense a physical quantity to generate an analog signal which corresponds with the physical quantity. The ADC is configured to compare the analog signal with a reference signal and generate a digital signal which corresponds with the analog signal using at least one counter circuit including the counter circuit. The control unit may be configured to control the sensing unit and the ADC.

In an embodiment, the sensing unit may include a pixel array which is configured to sense an incident light and generate the analog signal, and the pixel array may be further configured to sequentially output a first analog signal and a second analog signal for correlated double sampling. The first analog signal may represent a reset component, and the second analog signal may represent an image signal component.

The counter circuit may be configured to invert the N-bit counter output signal in response to at least one inversion control signal after the counter circuit completes a counting operation on the first analog signal and before the counter circuit starts a counting operation on the second analog signal.

The counter circuit may be configured to perform a coarse counting which provides the upper (N−M)-bit signals and a fine counting which provides the lower M-bit signals based on the first comparison signal and the second comparison signal in response to the pixel array sequentially outputting the first analog signal and the second analog signal, the first comparison signal is obtained by comparing the first analog signal, wherein the second comparison signal is obtained by at least delaying the first comparison signal.

In an embodiment, the second frequency may be $2^{(M-1)}$ times or $2^{(M-2)}$ times higher than the first frequency.

According to an aspect of an exemplary embodiment, a method of correlated double sampling includes counting a first analog signal which represents a reset component in a first counting operation; counting a second analog signal which represents a signal component in a second counting operation; and generating a digital signal which corresponds with a difference between the first analog signal and the second analog signal based on a plurality of results from the first counting operation and the second counting operation. Each of the first counting operation and the second counting operation includes counting a first counter clock signal which toggles with a first frequency to generate upper (N−M)-bit signals of N-bit counter output signals during a coarse counting interval based on a first comparison signal, N and M are natural numbers, N is greater than M, M is greater than or equal to 3, the N-bit counter output signals correspond to each of the first analog signal and the second analog signal; and counting a second counter clock signal which toggles with a second frequency which is higher than the first frequency to generate lower M-bit signals of the N-bit counter output signals during a fine counting interval based on the first comparison signal and a second comparison signal, and the fine counting interval follows the first coarse counting interval.

In an embodiment, the method may further include inverting the N-bit counter output signals in response to at least one inversion control signal after the counter circuit completes the first counting operation on the first analog signal and before the counter circuit initializes the counting operation on the second analog signal, and the second frequency may be $2^{(M-1)}$ times or $2^{(M-2)}$ times higher than the first frequency.

According to an aspect of an exemplary embodiment, there is provided a method of correlated double sampling for outputting a counter output signal, the method includes inputting a first counting enable signal during a course counting interval; inputting a second counting enable signal during a fine course counting interval; generating a plurality of upper bits of the counter output signal by counting a first counter clock signal in response to the first counting enable signal; and generating a plurality of lower bits of the counter output signal by counting a second counter clock signal in response to the second counting enable signal. The fine counting interval occurs after the course counting interval. The first counting enable signal toggles with a different frequency than the second counting enable signal.

Accordingly, a counter circuit generates upper bits by counting the first counter clock signal having lower frequency during the coarse counting interval and generates lower bits by counting the second counter clock signal having higher frequency during the fine counting interval to provide the counter output signal in each of a first counting operation that counts a first analog signal corresponding to a reset component and a second counting operation that counts a second analog signal corresponding to an image signal component. Therefore, power consumption may be greatly reduced by reducing a toggling number of the counter clock signal when compared with the related art counter that counts one input clock signal.

BRIEF DESCRIPTION OF THE DRAWINGS

Illustrative, non-limiting example embodiments will be more clearly understood from the following detailed description taken in conjunction with the accompanying drawings. In the drawings:

FIG. 32 is a block diagram illustrating an example of an interface used in the mobile device according to exemplary embodiments.

DETAILED DESCRIPTION OF THE EXEMPLARY EMBODIMENTS

Figure 1:
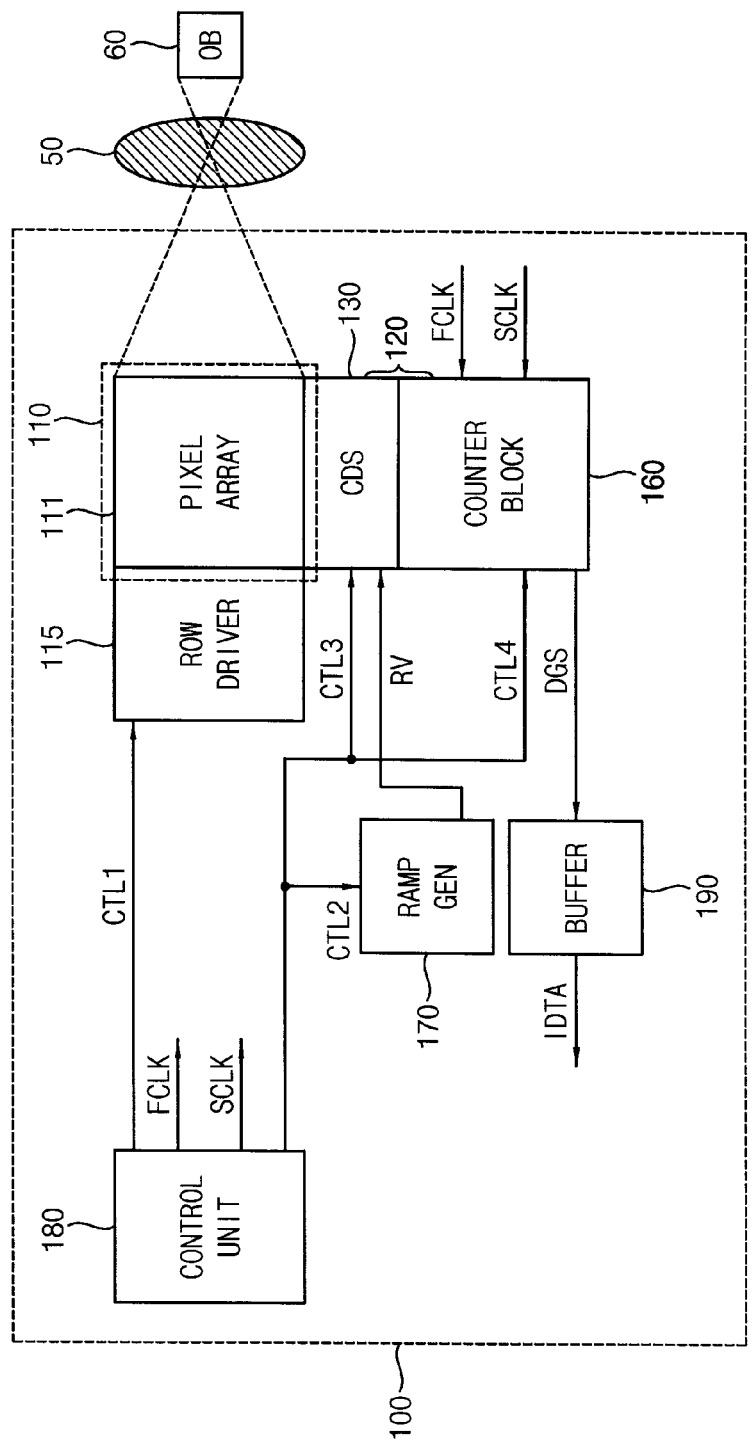
FIG. 1 is a block diagram illustrating an image sensor according to exemplary embodiments.

Various exemplary embodiments will be described more fully with reference to the accompanying drawings, in which embodiments are shown. Exemplary embodiments may, however, be embodied in many different forms and should not be construed as limited to the embodiments set forth herein. Rather, these embodiments are provided so that this disclosure will be thorough and complete, and will fully convey the scope to those skilled in the art. Like reference numerals refer to like elements throughout this application.

It will be understood that, although the terms first, second, etc., may be used herein to describe various elements, these elements should not be limited by these terms. These terms are used to distinguish one element from another. For example, a first element could be termed a second element. Similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, decimals, steps, operations, elements, and/or components, but do not preclude the presence or addition of one or more other.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an image sensor according to exemplary embodiments.

Referring to FIG. 1, an image sensor 100 includes a sensing unit 110 including a pixel array 111, a row driver 115, a correlated double sampling (CDS) block 130, a counter block 160, a ramp signal generator 170, a control unit 180, and a buffer 190. The CDS block 130 and the counter block 160 may constitute an analog-to-digital converter (ADC) 120.

The image sensor 100 is controlled in its operation by an image signal processor and may be used to optically sense an object 60 through a lens 50. The image signal processor may provide output data corresponding to the optically sensed object 60. The output data may then be communicated to a display unit that is capable of visually representing a display image in the likeness of the object 60. The display unit may include a computer, mobile phone etc.

The image signal processor (not shown) may receive image data provided from, e.g., the buffer 190 of the image sensor 100, and performs certain data processing functions on the image data to improve the quality or define the properties of the image ultimately displayed by the display unit. The image signal processor may be disposed external to the image sensor 100, or may be disposed internal to the image sensor 100.

The pixel array 111 includes a plurality of photo sensitive devices such as photo diodes or pinned photo diodes. The pixel array 111 senses some defined portion of the electromagnetic spectrum (hereinafter, referred to as "light", which may include visible and not visible (e.g., infrared) components of the electromagnetic spectrum). The photo sensitive devices detect and convert the light into corresponding analog signals (hereinafter, collectively and singularly referred to as "an image signal").

The control unit 180 may be used to provide control signals CLT1 through CLT4 to the row driver 115, the ramp signal generator 170, the CDS block 130, and the counter block 160, respectively, to control their respective and interrelated operations. The control unit 180 may generate first and second input clock signals SCLK and FCLK to the counter block 160.

The row driver 115 drives the pixel array 111 in row-wise units. For example, the row driver may generate a row selection signal such as the control signal CTL1. In response to the row selection signal, the pixel array 111 provides the CDS block 130 with a first analog signal corresponding to the reset component and a second analog signal corresponding to the image signal component. The CDS block 130 performs a CDS operation on the first and second analog signals.

The counter block 160 compares a ramp signal RV from the ramp signal generator 170 with a pixel output voltage (e.g., the first and second analog signals) from the pixel array 111 to output first and second comparison signals, and counts the first and second input clock signals SCLK and FCLK based on the first and second comparison signals to output a digital signal DGS corresponding to a correlated double-sampled signal to the buffer 190.

The buffer 190 temporarily stores the digital signal DGS from the counter block 160, and may perform sense and amplification operations on the digital signal DGS to generate corresponding image data IDTA to be output. Thus, in certain embodiments, the buffer 190 may include a plurality of column memory blocks (e.g., static random access memories (SRAMs)) provided to store respective groupings (e.g., columns) of count result data, and a sense amplifier provided to sense and amplify the digital count result data provided by the counter block 160.

Figure 2:
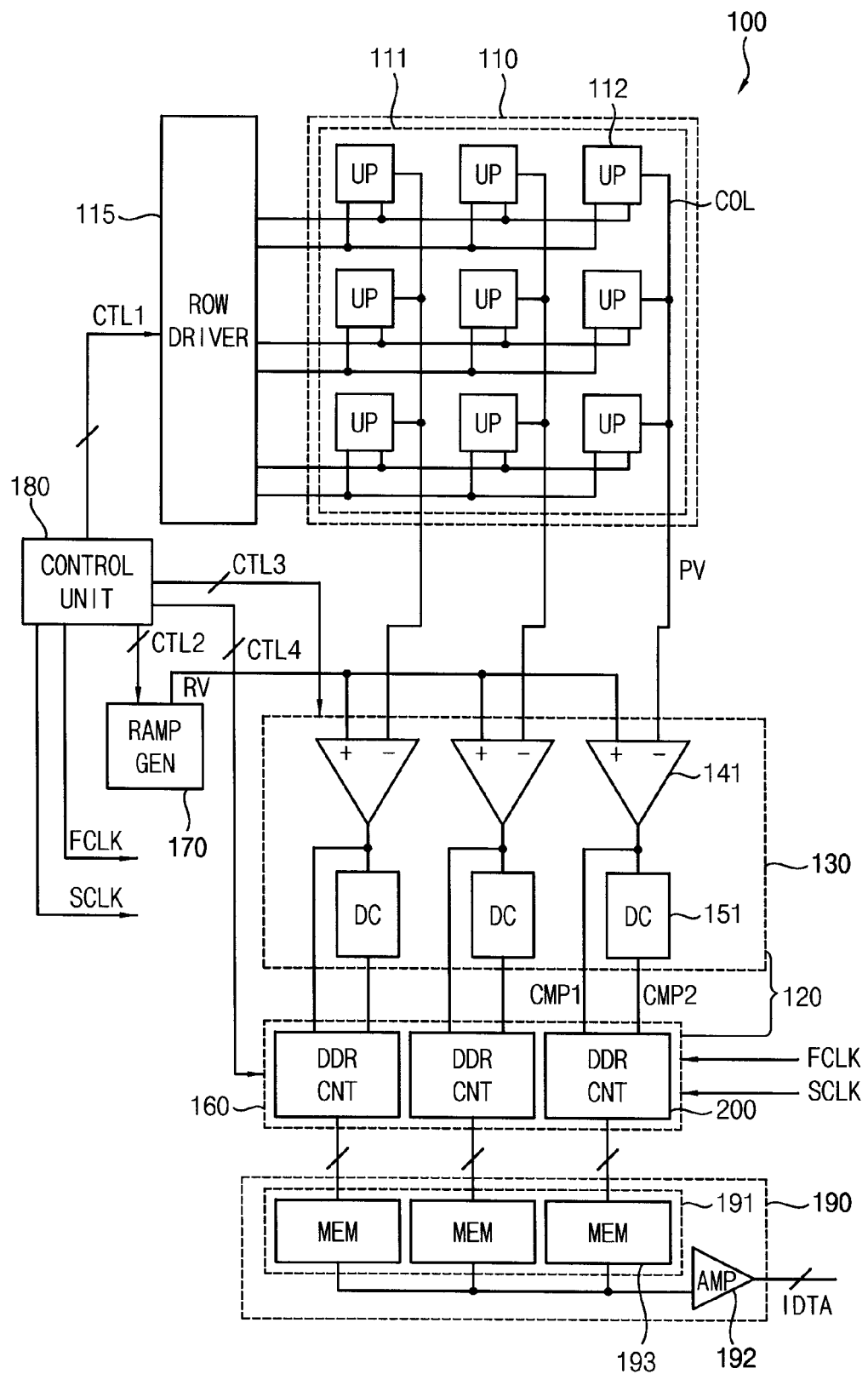
FIG. 2 further illustrates the image sensor of FIG. 1 according to exemplary embodiments.

FIG. 2 further illustrates the image sensor of FIG. 1 according to exemplary embodiments.

Referring to FIG. 2, the image sensor 100 includes the sensing unit 110 including the pixel array 111, the row driver 115, the CDS block 130, the counter block 160, the ramp signal generator 170, the control unit 180, and the buffer 190. The CDS block 130 and the counter block 160 may constitute the ADC 120.

The pixel array 111 may include a plurality of unit pixels 112 arranged in a matrix. Various sub-sets of the unit pixels 112 are connected in respective rows and columns, among a plurality of row and a plurality of column. The unit pixels 112 may include red pixels that convert light in the defined red spectrum into a corresponding electrical signal, green pixels that convert light in a defined green spectrum into a corresponding electrical signal, and a blue pixel that converts light in a defined blue spectrum into a corresponding electrical signal. In some embodiments, one or more color filters may be included in relation to individual unit pixels 111 in order to filter incident light according to a particular spectrum.

The row driver 120 may be configured to receive and decode a row control signal CTL1 (e.g., an address signal) provided by (or through) the control unit 180, and select at least one row line, among the row lines, in the pixel array 111 in response to a decoded row control signal.

The CDS block 130 may be configured to perform CDS on a respective pixel output voltage PV provided by individual unit pixels 112 which are connected to, e.g., one of the column lines COL in the pixel array 111. The CDS block 130 includes a plurality of comparators 141 and a plurality of delay cells 151. Each of the comparators 141 is connected to the unit pixels 112 by column lines COL and to the ramp signal generator 170. Each of the delay cells 151 is connected to an output of a corresponding one of the comparators 141. The unit pixel 112 is connected to a first (e.g., negative) input terminal of the comparator 141, and the ramp signal generator 170 is connected to a second (e.g., positive) input terminal of the comparator 141. Each of the comparators 141 compares the pixel output voltage PV and the ramp signal (or a reference signal) RV to output a first comparison signal CMP1, and each of the delay cells 151 inverts and delays the first comparison signal CMP1 to output a second comparison signal CMP2.

The pixel output voltage PV may represent a valid physical quantity such as light intensity. The comparator 141 may output the first comparison signal CMP1 twice in a first counting operation on the first analog signal corresponding to the reset component and in a second counting operation on the second analog signal corresponding to the image signal component. The comparator 141 may output the first comparison signal CMP1 in the first and second counting operation using ramp signal RV, so that the difference between the image signal component and the reset component is detected and output as a function of the slope of the ramp signal RV.

The counter block 160 includes a plurality of counter circuits 200, and each of the counters 200 is connected to the output terminal of the comparator 141 and the output terminal of the delay cell 151. The counter circuit 200 counts the first and second comparison signals CMP1 and CMP2 according to the first and second input clock signals SCLK and FCLK from the control unit 180 to output the digital signal DGS. A counter controller (not illustrated) in the control unit 180 may generate the first and second input clock signals SCLK and FCLK.

Each counter 200 may be an up and down counter or a bit-wise inversion counter. The bit-wise inversion counter may perform a similar operation to that of the up and down counter. For instance, the bit-wise inversion counter performs up-counting and bit inversion to effectively implement a 1's complement approach to counting. Therefore, the bit-wise inversion counter may perform reset counting and invert a result of the reset counting, such that the result is converted into a 1's complement form (i.e., a negative value).

The buffer 190 includes a column memory block 191 and a sense amplifier 192. The column memory block 191 includes a plurality of individual memories 193. The plurality of individual memories 193 respectively operate in response to a memory control signal provided by a memory controller (not shown) and may be disposed within the column memory block 191 (or within the timing generator 170). The plurality of individual memories 193 may operate in response to the control signal provided by the control unit 180. In some embodiments, each individual memory 193 may be an SRAM.

In response to the memory control signal, the column memory block 191 may be used to temporarily store the digital signals provided from the counter circuits 200 and then output an amplified version of the same via the sense amplifier 192 as the digital data IDTA or the image signal.

Figure 3:
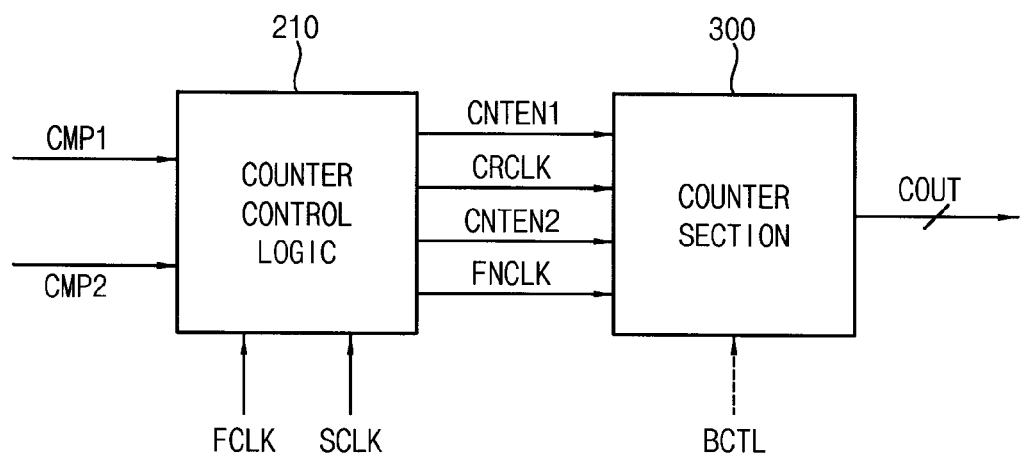
FIG. 3 is a block diagram illustrating one of the counter circuits in FIG. 2 according to exemplary embodiments.

FIG. 3 is a block diagram illustrating one of the counter circuits in FIG. 2 according to exemplary embodiments.

Referring to FIG. 3, a counter circuit 200a may include a counter control logic 210 and a counter section 300.

The counter control logic 210 may generate a first counting enable signal CNTEN1, a first counter clock signal CRCLK, a second counting enable signal CNTEN2 and a second counter clock signal FNCLK based on the first comparison signal CMP1, the second comparison signal CMP2, the first input clock signal SCLK having a first frequency and a second input clock signal FCLK having a second frequency. The first comparison signal CMP1 is inverted and delayed, such that the second comparison signal CMP2 is output. The second frequency may be 2^(M−1) times or 2^(M−2) times higher than the first frequency. M is a natural number equal to or greater than three.

The counter section 300 may generate N-bit counter output signal COUT based on the first counting enable signal CNTEN1, the first counter clock signal CRCLK, the second counting enable signal CNTEN2, and the second counter clock signal FNCLK. N is a natural number greater than M. The counter section 300 may further receive a bit control signal BCTL for adjusting a ratio of lower M-bit signals of the N-bit counter output signal COUT and upper (N−M)-bit signals of the N-bit counter output signal COUT.

Figure 4:
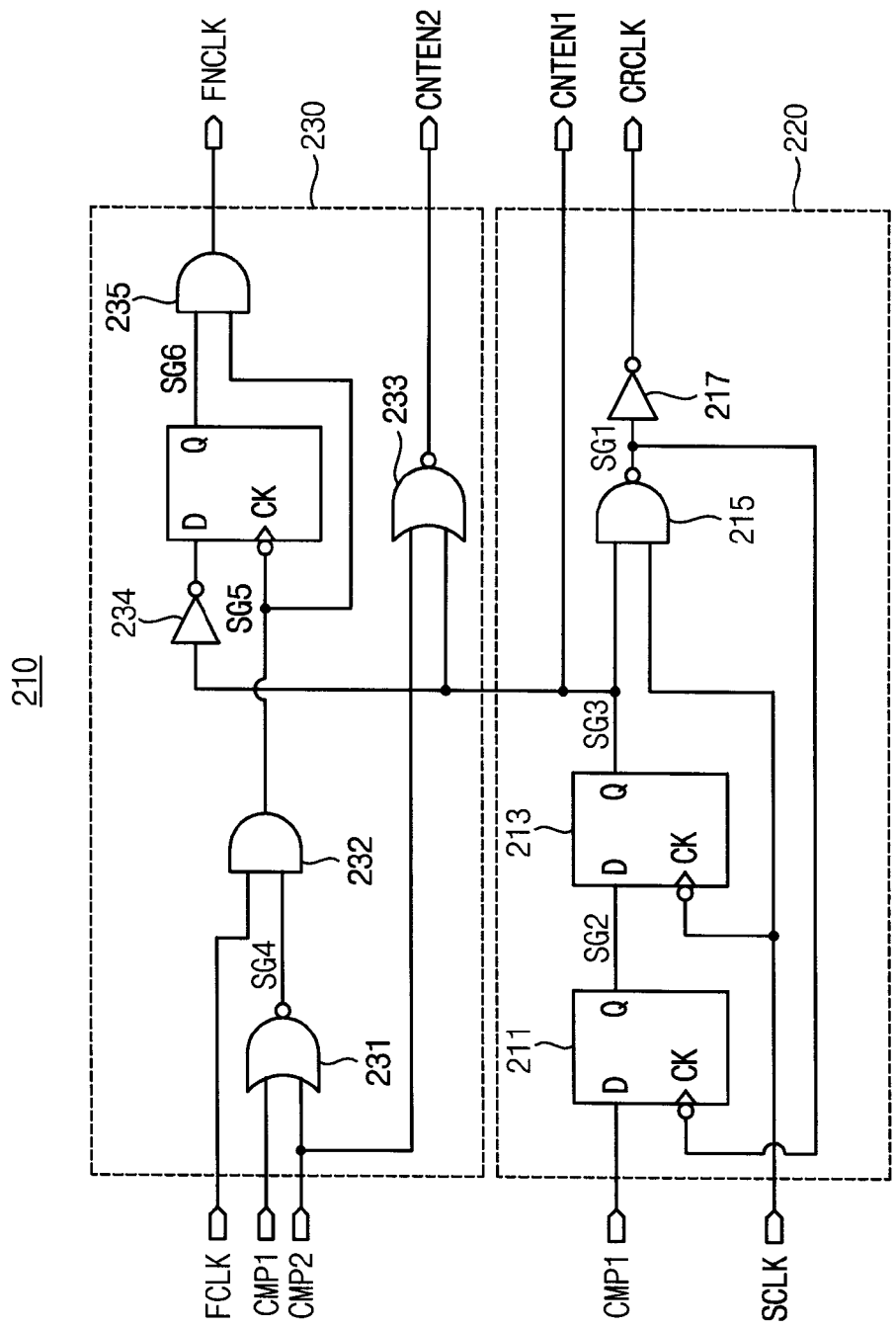
FIG. 4 is a circuit diagram illustrating the counter control logic in FIG. 3 according to exemplary embodiments.

FIG. 4 is a circuit diagram illustrating the counter control logic in FIG. 3 according to exemplary embodiments.

Referring to FIG. 4, the counter control logic 210 includes first and second control sections 220 and 230.

The first control section 220 may generate the first counting enable signal CNTEN1 and the first counter clock signal CRCLK based on the first comparison signal CMP1 and the first input clock signal SCLK. The second control section 230 may generate the second counting enable signal CNTEN2 and the second counter clock signal FNCLK based on the first comparison signal CMP1, the second comparison signal CMP2, the first input clock signal SCLK, and the first counting enable signal CNTEN1.

The first control section 220 includes falling edge-triggered D flip-flops 211 and 213, a NAND gate 215, and an inverter 217. The D flip-flop 211 has a data terminal D receiving the first comparison signal CMP1 and an output terminal Q providing an output signal SG2. The D flip-flop 213 has a data terminal D receiving the output signal SG2, an output terminal providing a signal SG3 (e.g., the first counting enable signal CNTEN1), and a clock terminal CK receiving the first input clock signal SCLK. The NAND gate 215 performs a NAND operation on the signal SG3 and the first input clock signal SCLK to provide a signal SG1, and the inverter 217 inverts the signal SG1 to provide the first counter clock signal CRCLK. The signal SG1 is provided to a clock terminal CK of the D flip-flop 211.

The second control section 230 includes a NOR gate 231, an AND gate 232, a NOR gate 233, an inverter 234, a falling edge-triggered D flip-flop 235, and an AND gate 236. The NOR gate 231 performs NOR operation on the first and second comparison signals CMP1 and CMP2 to provide a signal SG4. The AND gate 232 performs an AND operation on the second input clock signal FCLK and the signal SG4 to provide a signal SG5. The NOR gate 233 performs a NOR operation on the second comparison signal CMP2 and the first counting enable signal CNTEN1 to provide the second counting enable signal CNTEN2. The inverter 234 inverts the first counting enable signal CNTEN1, and the D flip-flop 235 has a data terminal D connected to an output of the inverter 234 and an output terminal Q providing a signal SG6. The AND gate 236 performs an AND operation on the signals SG5 and SG6 to provide the second counter clock signal FNCLK.

Figure 5:
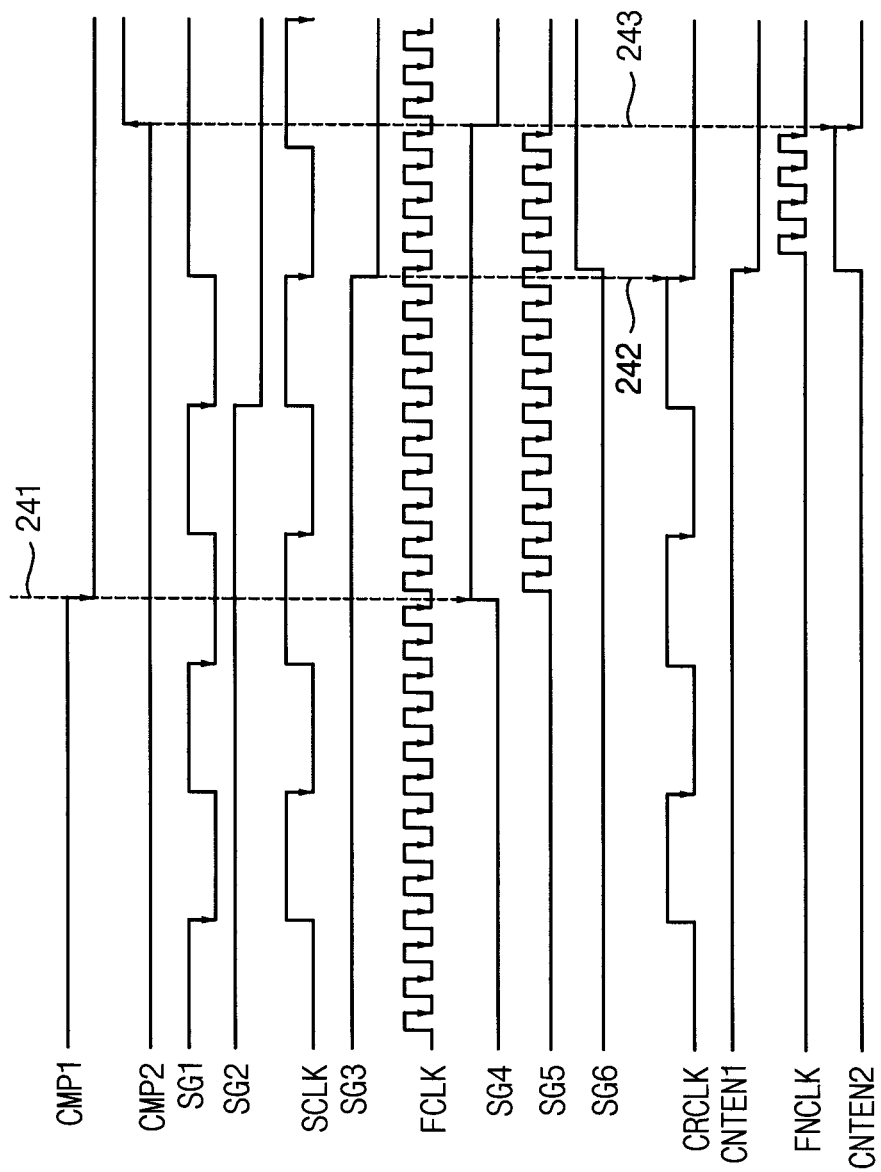
FIG. 5 is a timing diagram illustrating various signals of the counter control logic of FIG. 4.

FIG. 5 is a timing diagram illustrating various signals of the counter control logic of FIG. 4.

Referring to FIGS. 4 and 5, the signal SG1, i.e., the first counting enable signal CNTEN1 is generated based in the first comparison signal CMP1 and the first input clock signal SCLK. The first clock counter signal CRCLK corresponds to the first input clock signal SCLK during a coarse counting interval in which the first clock enable signal CNTEN1 is at a high level. In other words, the first clock counter signal CRCLK is toggling with the first frequency as the first input clock signal SCLK during the coarse counting interval in which the first clock enable signal CNTEN1 is at the high level.

The signal SG4 is enabled during from a falling edge of the first comparison signal CMP1 to a rising edge of the second comparison signal CMP2 according to the first and second comparison signals CMP1 and CMP2. In addition, the signal SG5 is toggling with a frequency of the second input clock signal FCLK based on the second input clock signal FCLK and the signal SG4 during a time when the signal SG4 is enabled. The second counting enable signal CNTEN2 is enabled during a fine counting interval corresponding from a falling edge of the first counting enable signal CNTEN1 to a rising edge of the second comparison signal CMP2 based on the first counting enable signal CNTEN1 and the second comparison signal CMP2. Therefore, the second counter clock signal FNCLK is toggling with a frequency of the second input clock signal FCLK based on the signals SG5 and SG6. The second frequency is higher than the first frequency.

The first control section 220 generates the first counting enable signal CNTEN1 such that the first counting enable signal CNTEN1 is enabled during the coarse counting interval that includes a first interval during which the first comparison signal CMP1 is enabled and a second interval including at least one falling edge of the first counter clock signal CRCLK1 that does not overlap with the first interval after the first comparison signal CMP1 is disabled. The second control section 230 generates the second counting enable signal CNTEN2 such that the second counting enable signal CNTEN2 is enabled during the fine counting enable interval that includes a time from a second time when the coarse counting interval is disabled to a third time when the second comparison signal CMP2 is enabled. Therefore, a set-up time violation problem may be solved when a point when the second comparison signal CMP1 overlaps with the low level of the first input clock signal SCLK.

As a reference numeral 241 indicates, the signal SG4 transitions to a high level in response to the first comparison signal CMP1 transitioning to a low level. Further, as a reference numeral 242 indicates, the first counter clock signal CRCLK stops toggling when the signal SG3 transitions to a low level. As a reference numeral 243 indicates, the first counting enable signal CNTEN1 is disabled in response to the second comparison signal CMP2 transitioning to a high level.

Therefore, the counter control logic 210 of FIG. 4 generates the first counter clock signal CRCLK toggling with a first frequency of the first input clock signal SCLK during the coarse counting interval and generates the second counter clock signal FNCLK with a second frequency of the second input clock signal FCLK during the fine counting interval using the first and second comparison signals CMP1 and CMP2 as control signals.

Figure 6:
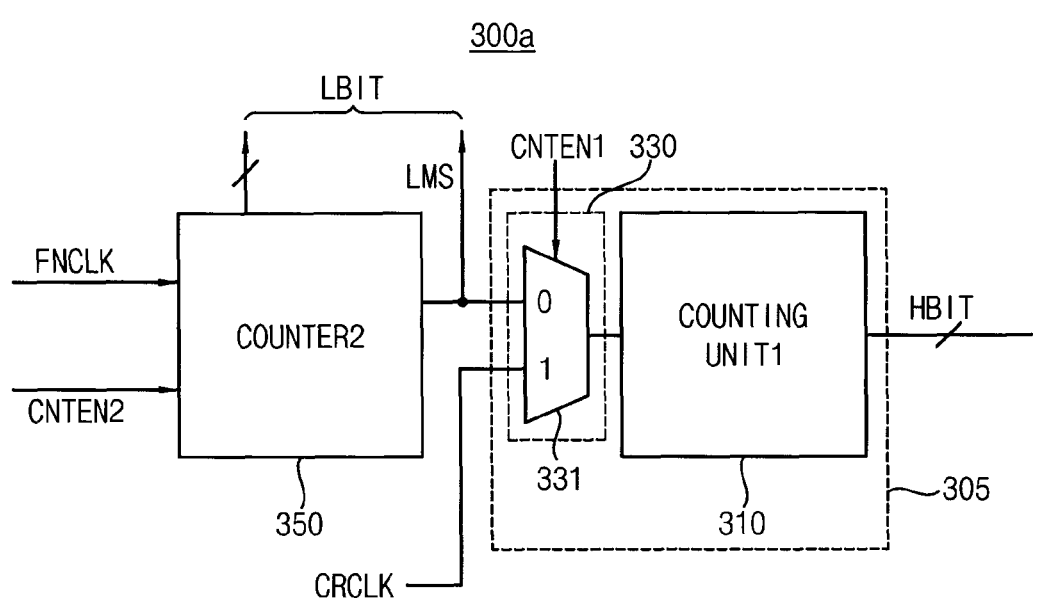
FIG. 6 illustrates an example of the counter section in FIG. 3 according to exemplary embodiments.

FIG. 6 illustrates an example of the counter section in FIG. 3 according to exemplary embodiments.

Referring to FIG. 6, a counter section 300a includes first and second counters 305 and 350. The first counter 305 may include a switching unit 330 having a multiplexer 331 and a first counting unit 310. The first counter 305 counts the first counter clock signal CRCLK toggling with the first frequency to generate upper (N−M)-bit signals HBIT of the N-bit counter output signals COUT, in response to the first counting enable signal CNTEN1 during the coarse counting interval. The second counter 350 counts the second counter clock signal FNCLK toggling with a second frequency higher than the first frequency to generate lower M-bit signals LBIT of the N-bit counter output signals COUT, in response to the second counting enable signal CNTEN2 during the fine counting interval succeeding to the coarse counting interval. The second frequency may be 2^(M−1) times or 2^(M−2) times higher than the first frequency.

The switching unit 330 selects one of a most significant bit (MSB) signal LMS of the lower M-bit signals LBIT and the first counter clock signal CRCLK in response to the first counting enable signal CNTEN1 and provides the selected one of the MSB signal LMS and the first counter clock signal CRCLK to the first counting unit 310. For example, during the coarse counting interval, when the first counting enable signal CNTEN1 is a high level, the switching unit 330 provides the first counting unit 310 with the first counter clock signal CRCLK1 toggling with the first frequency. During the fine counting interval, when the first counting enable signal CNTEN1 is low level, the switching unit 330 provides the first counting unit 310 with MSB signal LMS of the lower M-bit signals LBIT. The multiplexer 331 serves as a clock path that provides the first counting unit 310 with the first counter clock signal CRCLK1 toggling with the first frequency during the coarse counting interval when the first counting enable signal CNTEN1 is the high level.

Figure 7:
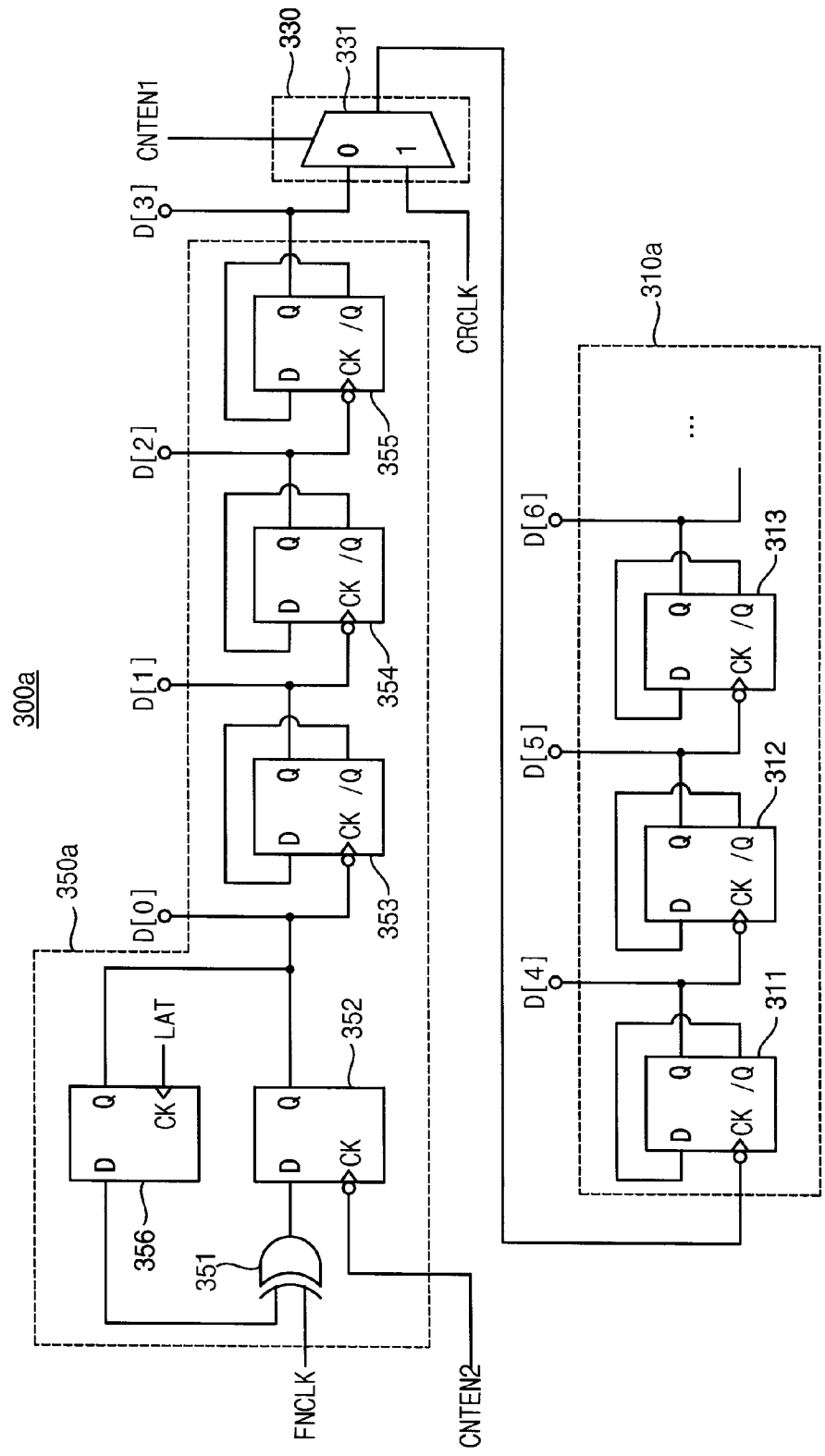
FIG. 7 is a circuit diagram illustrating the counter section of FIG. 6 according to exemplary embodiments.

FIG. 7 is a circuit diagram illustrating the counter section of FIG. 6 according to exemplary embodiments.

FIG. 7 illustrates an example when the second counter 350 in FIG. 6 counts lower four-bits.

Referring to FIG. 7, the counter circuit 300a includes the switching unit 330, a first counting unit 310a, and a second counter 350a. The second counter 350a includes an exclusive OR gate 351 and a plurality of falling edge-triggered D flip-flops 351 through 356. The first counting unit 310a includes a plurality of falling edge-triggered D flip-flops 311, 312 and 313.

The first counting unit 310a receives first counter clock signal CRCLK1 toggling with the first frequency during the coarse counting interval and receives MSB signal D[3] when the first counting enable signal CNTEN1 is the low level. The D flip-flops 311, 312 and 313 generate the upper-bit signals HBIT. Each of the D flip-flops 311, 312, and 313 has an inverted output terminal fed-back to a data terminal D, a clock terminal receiving adjacent lower bit signal, and an output terminal providing each of the upper (N−M)-bit signals HBIT (e.g., D[4], D[5], D[6], . . . ). The clock terminal CK of the D flip-flop receives the first counter clock signal CRCLK during the coarse counting interval and receives MSB signal D[3] when the first counting enable signal CNTEN1 is the low level. Therefore, the first counter 310a counts the first counter clock signal CRCLK toggling with the first clock signal to generate the upper (N−M)-bit signals HBIT.

The D flip-flop 356 in the second counter 350a operates as a latch that latches LSB D[0] of the lower M-bit signals in response to a latch control signal LAT. The exclusive OR gate 351 performs exclusive OR operation on an input of the latch 356 and the second counter clock signal FNCLK. The D flip-flop 352 has a data terminal receiving the output of the exclusive OR gate 351, a clock terminal receiving the second counting enable signal CNTEN2 and an output terminal Q providing the LSB D[0]. The D flip-flops 353 through 355 are cascaded-connected to the D flip-flop 352 to generate (second through Mth)-bit signals D[1], D[2] and D[3]. Each of the D flip-flops 353~355 has an inverted output terminal /Q fed-back to a data terminal D, a clock terminal CK receiving an adjacent lower bit signal and an output terminal Q providing each of the (second through Mth)-bit signals D[1], D[2] and D[3].

Since the clock terminal CK of the D flip-flop 352 receives the second counting enable signal CNTEN2, the second counter 350 counts the second counter clock signal FNCLK toggling with the second frequency during the fine counting interval to generate the lower M-bit signals D[0], D[1], D[2] and D[3]. Since the D flip-flops 352 and 356 operate as latch capable of latching the bit D[0], the counter circuit 300a operates as s double data rate (DDR) counter that performs counting operation twice during cycle period.

Figure 8:
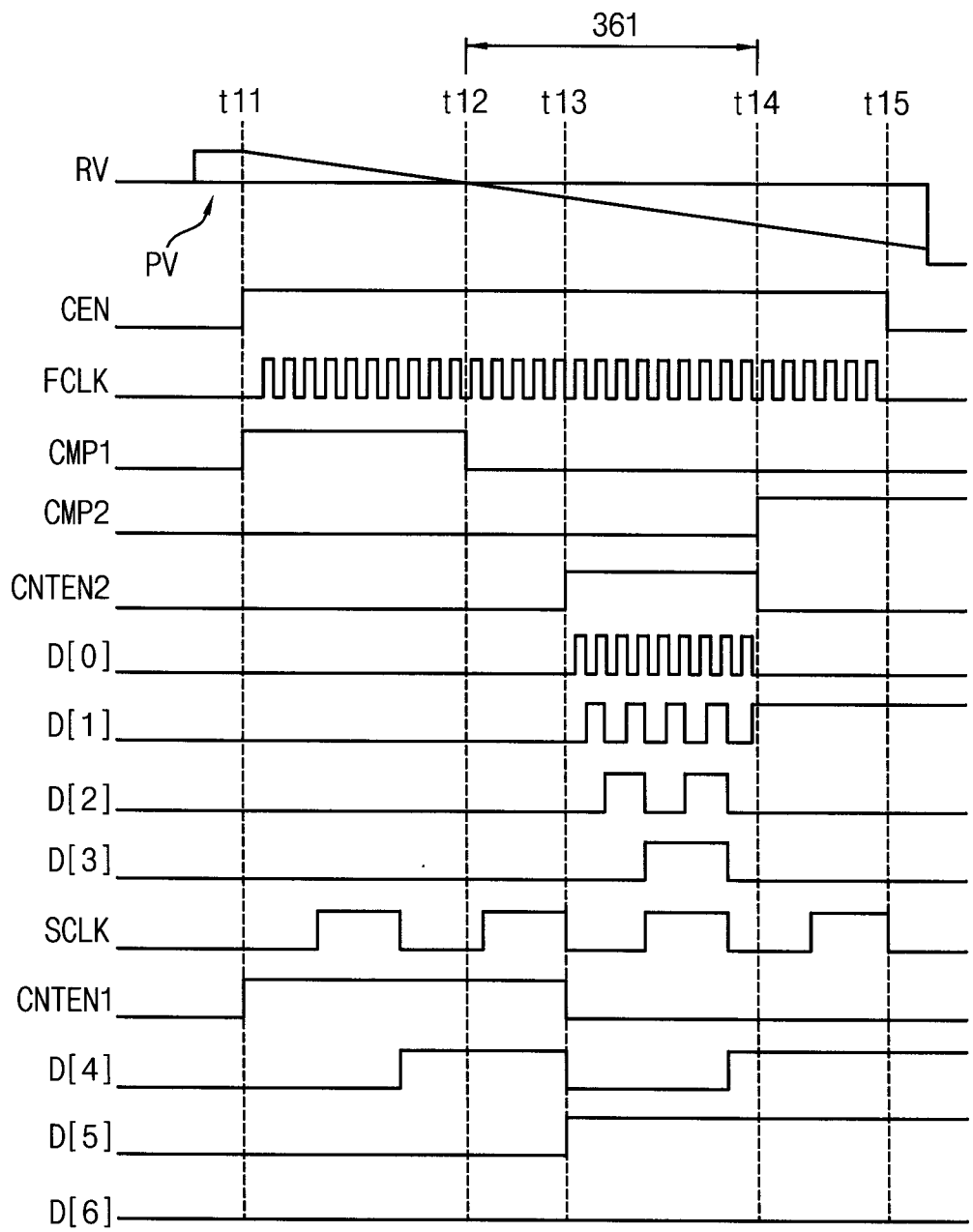
FIG. 8 is a timing diagram illustrating operation of the counter circuit of FIG. 3 according to exemplary embodiments.

FIG. 8 is a timing diagram illustrating operation of the counter circuit of FIG. 3 according to some example embodiments.

Referring to FIGS. 2, 3 and FIGS. 6 through 8, the comparator 141 in the CDS block 130 compares the ramp signal RV (or the reference signal) and the pixel output voltage RV to generate the first and second comparison signals CMP1 and CMP 2 to each counter circuit 200 in the counter block 160. The counter block 160 is enabled from time t11 to time t15 in response to a counter enable signal CEN, which may be included in the control signal CLT4. The first comparison signal CMP1 is maintained at a high level from the time t11 to time t12 when the ramp signal RV reaches the level of the pixel output voltage PV. The first counting enable signal CNTEN1 is enabled from the time t11 to time t13 in response to the first comparison signal CMP1 and the first input clock signal SCLK. In other words, an interval from the time t11 to the time t13 corresponds to the coarse counting interval. The first counter 305a counts the first input clock signal SCLK toggling with the first clock signal to generate the upper (N−M)-bit signals D[4], D[5] and D[6].

The second counting enable signal CNTEN2 is enabled from the time t13 to time t14. The first counting enable signal CNTEN1 is disabled at the time t13. The second comparison signal CMP2 transitions to a high level at the time t14. In other words, an interval from the time t13 to the time t14 corresponds to the fine counting interval. The second counter 350a counts the second input clock signal FCLK toggling with the second frequency to generate the lower M-bit signals D[0], D[1], D[2] and D[3] during the fine counting interval.

In FIG. 8, the lower M-bit signals LBIT include four bits, when the counter circuit 200a generates a 7-bit counter output signal COUT. Since the lower M-bit signals LBIT include four bits, the second frequency of the second counter clock signal FNCLK may be $2^{(4-1)}=8$ times higher than the first frequency of the first counter clock signal CRCLK. The counter enable signal CEN is disabled at the time t15, the counter circuit 200a outputs the counter output signal COUT corresponding to '0110010' after the time t15. The counter output signal COUT corresponding to '0110010' corresponds to '50' in decimal value, which corresponds to a number of clocks of the second input clock signal FCLK during the counter enable signal CEN is enabled.

The upper N–M bit signals HBIT are toggling in response to a falling edge of the first counter clock signal CRCLK and the lower M-bit signals are toggling in response to a falling edge of the second counter clock signal FNCLK.

Figure 9:
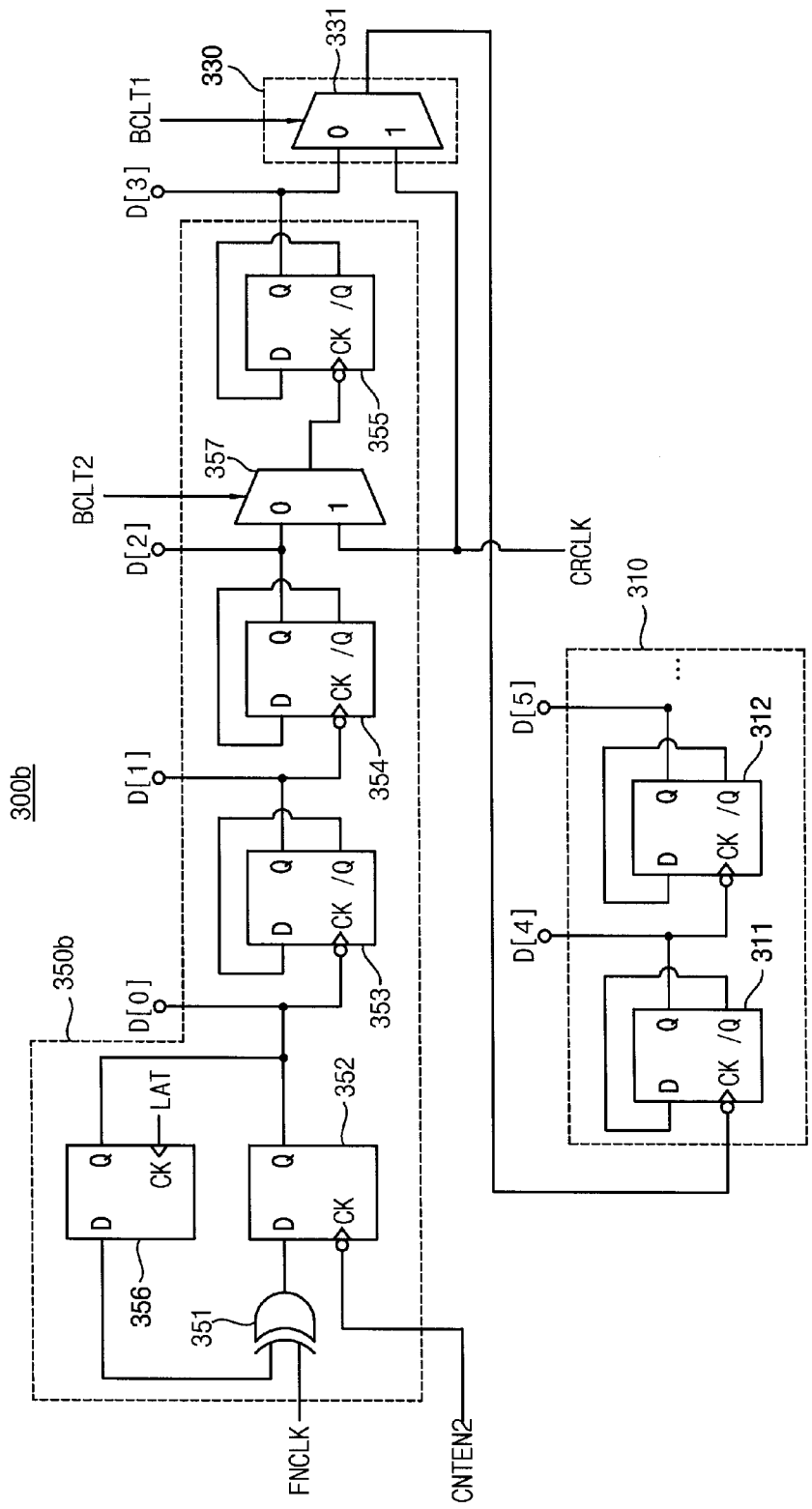
FIG. 9 illustrates the counter section of FIG. 6 according to exemplary embodiments.

FIG. 9 illustrates the counter section of FIG. 6 according to exemplary embodiments.

Counter section 300b of FIG. 9 differs from the counter section 300a of FIG. 7 in that a multiplexer 357 is connected between the D flip-flops 354 and 355.

The multiplexer 357 selects one of the bit signal D[2] and the first counter clock signal CRCLK in response to a bit control signal BCTL2 to provide the selected one of the bit signal D[2] and the first counter clock signal CRCLK to a clock terminal CK of the D flip-flop 355. The multiplexer 331 selects one of the bit signal D[3] and the first counter clock signal CRCLK in response to a bit control signal BCTL1 to provide the selected one of the big signal D[3] and the first counter clock signal CRCLK to a clock terminal CK of the D flip-flop 311. The bit control signals BCTL1 and BCTL2 have complementary logic levels. Therefore, the bit control signals BCTL1 and BCTL2 may be included in the first counting enable signal CNTEN1.

When the bit control signal BCTL1 is a high level, the counter circuit 300b of FIG. 9 is substantially the same as the counter circuit 300a of FIG. 7. When the bit control signal BCTL1 is low level, the bit control signal BCTL2 becomes a high level and the second counter circuit 350b generates lower three-bit signals D[0], D[1], and D[2] during the coarse counting interval. In this case, the second frequency of the second counter clock signal FNCLK may be 2 times higher than the first frequency of the first counter clock signal CRCLK.

Therefore, the number of the lower M-bit signals of the counter output signal COUT may be varied in response to at least one bit control signal BCTL. When the number of the lower M-bit signals of the counter output signal COUT is varied, operation speed of the counter circuit 200a may be increased. Since the first counter 305 operate with $½^{(M-1)}$ frequency of the second frequency, operating frequency of the first counter 305 becomes lower as the bit number of the counter output signal COUT increases. Therefore, when the bit number of the lower M-bit signals is decreased, operating frequency of the first counter 305 may increase.

The counter circuit 200a described with reference to FIGS. 3 through 9, generates upper bits by counting the first counter clock signal CRCLK having lower frequency during the coarse counting interval, and generates lower bits by counting the second counter clock signal FNCLK having higher frequency during the fine counting interval to provide the counter output signal COUT. Therefore, power consumption may be greatly reduced by reducing a toggling number of the counter clock signal when compared with the related art counter that counts one input clock signal.

Figure 10:
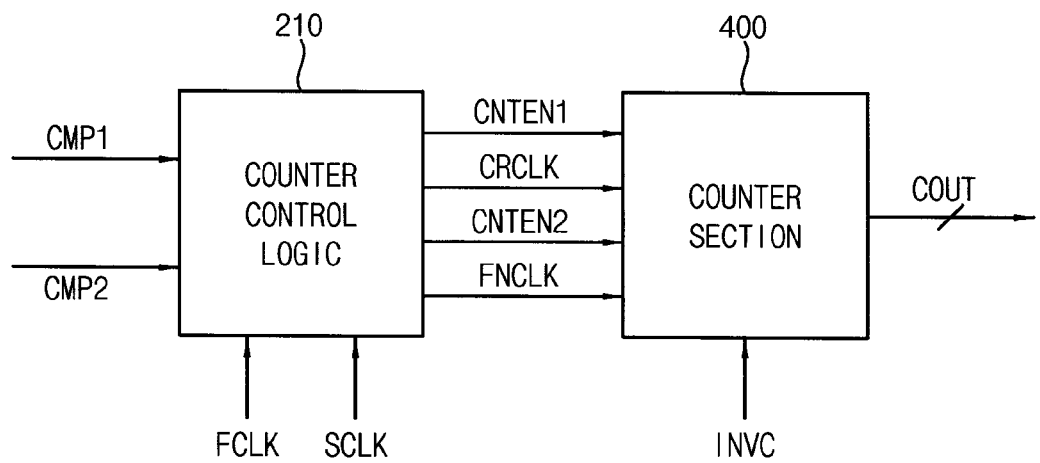
FIG. 10 is a block diagram illustrating a counter circuit having inversion function according to exemplary embodiments.

FIG. 10 is a block diagram illustrating a counter circuit having inversion function according to exemplary embodiments.

Referring to FIG. 10, a counter circuit 200b may include the counter control logic 210 and a counter section 400. The counter control logic 210 may generate the first counting enable signal CNTEN1, the first counter clock signal CRCLK, the second counting enable signal CNTEN2, and the second counter clock signal FNCLK based on the first comparison signal CMP1, the second comparison signal CMP2, the first input clock signal SCLK having a first frequency, and a second input clock signal FCLK having a second frequency. The first comparison signal CMP1 is inverted and delayed such that the second comparison signal CMP2 is output. The second frequency may be $2^{(M-1)}$ times or $2^{(M-2)}$ times higher than the first frequency. M is a natural number equal to or greater than three.

The counter section 400 may generate N-bit counter output signal COUT based on the first counting enable signal CNTEN1, the first counter clock signal CRCLK, the second counting enable signal CNTEN2, and the second counter clock signal FNCLK. N is a natural number greater than M. The counter section 400 may further receive an inversion control signal INVC for inverting the N-bit counter output signal COUT. In other words, the counter section 400 may store a 1's complement form of the counter output signal COUT.

The counter control logic 210 is described in detail with reference to FIG. 4.

Figure 11:
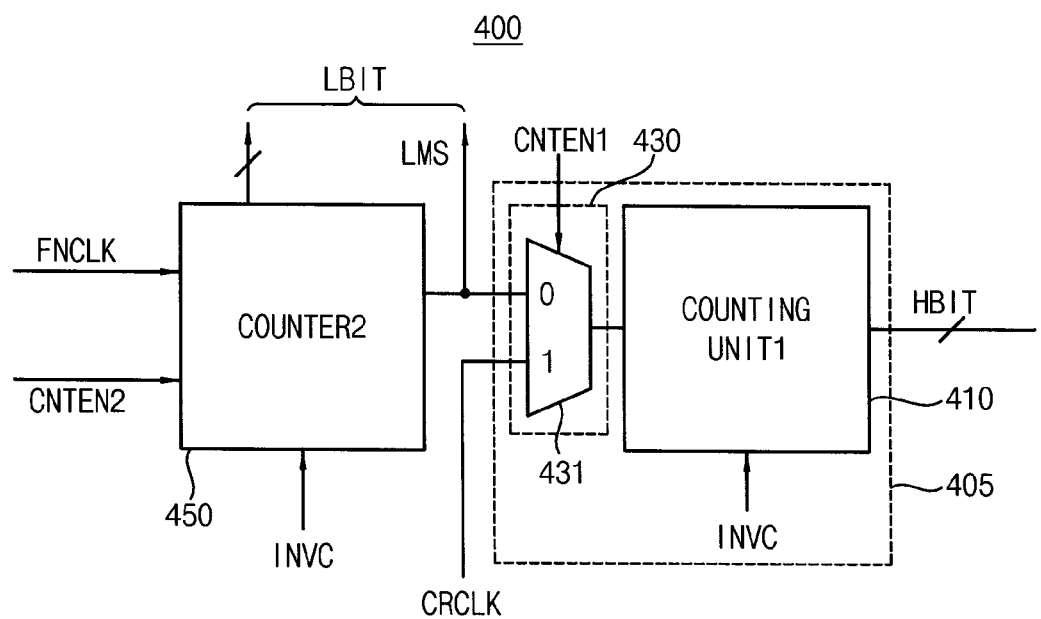
FIG. 11 is a block diagram illustrating the counter section in FIG. 4 according to exemplary embodiments.

FIG. 11 is a block diagram illustrating the counter section in FIG. 4 according to exemplary embodiments.

Referring to FIG. 11, the counter section 400 includes first and second counters 405 and 450. The first counter 405 may include a switching unit 430 having a multiplexer 431 and a first counting unit 410. The first counter 405 counts the first counter clock signal CRCLK toggling with the first frequency to generate upper (N–M)-bit signals HBIT of the N-bit counter output signals COUT, in response to the first counting enable signal CNTEN1 during the coarse counting interval. The second counter 450 counts the second counter clock signal FNCLK toggling with a second frequency higher than the first frequency to generate lower M-bit signals LBIT of the N-bit counter output signals COUT, in response to the second counting enable signal CNTEN2 during the fine counting interval succeeding to the coarse counting interval. The second frequency may be $2^{(M-1)}$ times or $2^{(M-2)}$ times higher than the first frequency.

The first and second counters 405 and 450 may provide a 1's complement form of the counter output signal COUT in response to the inversion control signal INVC.

Figure 12:
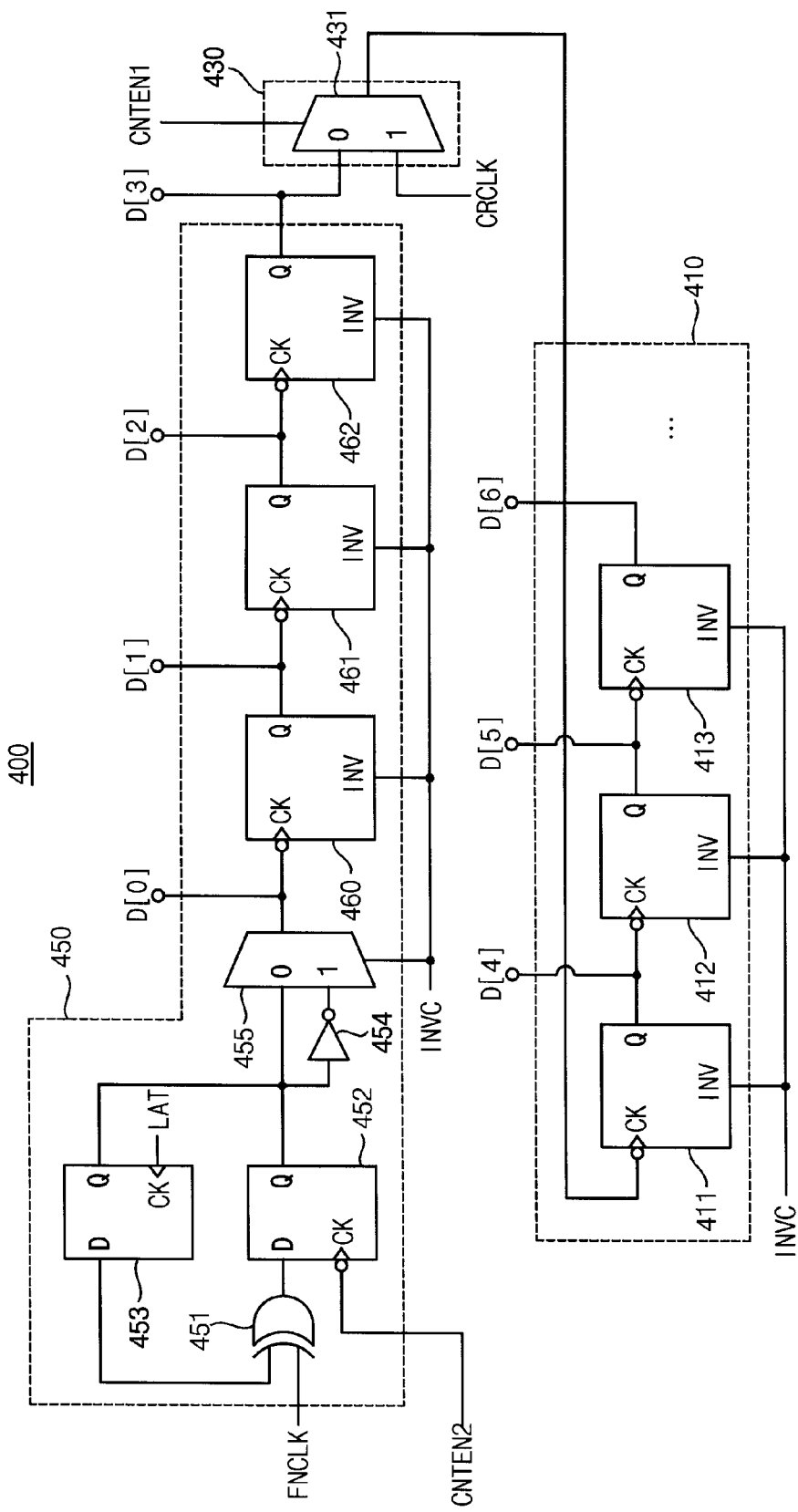
FIG. 12 is a circuit diagram illustrating the counter section of FIG. 11 according to exemplary embodiments.

FIG. 12 is a circuit diagram illustrating the counter section of FIG. 11 according to exemplary embodiments.

FIG. 12 illustrates an example when the second counter 450 in FIG. 11 counts lower four-bits.

Referring to FIG. 12, the counter section 400 includes the switching unit 430, the first counting unit 410, and a second counter 450. The second counter 450 includes an exclusive OR gate 451, a plurality of falling edge-triggered D flip-flops 452 and 453, an inverter 454, a multiplexer 455, and a plurality of sub-counting units 460 through 462. The first counting unit 410 includes a plurality of sub-counting units 411 through 413.

The first counting unit 410 receives first counter clock signal CRCLK1 toggling with the first frequency during the coarse counting interval and receives MSB signal D[3] when the first counting enable signal CNTEN1 is a low level. The sub-counting units 411 through 413 generate the upper-bit signals HBIT and each of the sub-counting units 411 through 413 has a clock terminal receiving adjacent lower bit signal and an output terminal providing each of the upper (N−M)-bit signals HBIT (i.e., D[4], D[5], D[6], . . . ) and an inversion terminal INV receiving the inversion control signal INVC. Therefore, the first counting unit 410 counts first counter clock signal CRCLK toggling with the first frequency to generate the upper (N−M)-bit signals HBIT during the coarse counting interval of a first counting operation. In addition, the first counting unit 410 may invert the upper (N−M)-bit signals HBIT in response to the inversion control signal INVC after the first counting operation is completed.

The D flip-flop 453 in the second counter 450 operates as a latch that latches LSB D[0] of the lower M-bit signals in response to a latch control signal LAT. The exclusive OR gate 451 performs exclusive OR operation on an input of the latch 453 and the second counter clock signal FNCLK. The D flip-flop 452 has a data terminal receiving the output of the exclusive OR gate 451, a clock terminal receiving the second counting enable signal CNTEN2 and an output terminal Q providing the LSB D[0]. The inverter 454 inverts an output of the D flip-flop 452, and the multiplexer 455 selects one of outputs of the inverter 454 and the D flip-flop 452 to provide the bit signal D[0]. The sub-counting units 460 through 462 are cascaded-connected to the multiplexer 455 to generate (second through Mth)-bit signals D[1], D[2] and D[3]. Each of the sub-counting units 460 through 462 has a clock terminal receiving adjacent lower bit signal and an output terminal providing clock terminal CK receiving an adjacent lower bit signal, an output terminal Q providing each of the (second through Mth)-bit signals D[1], D[2] and D[3] and an inversion terminal INV receiving the inversion control signal INVC. Therefore, the second counter 450 counts second counter clock signal FNCLK toggling with the second frequency to generate the lower M-bit signals LBIT during the fine counting interval of the first counting operation. In addition, the second counter 450 may invert the lower M-bit signals LBIT in response to the inversion control signal INVC after the first counting operation is completed.

Figure 13:
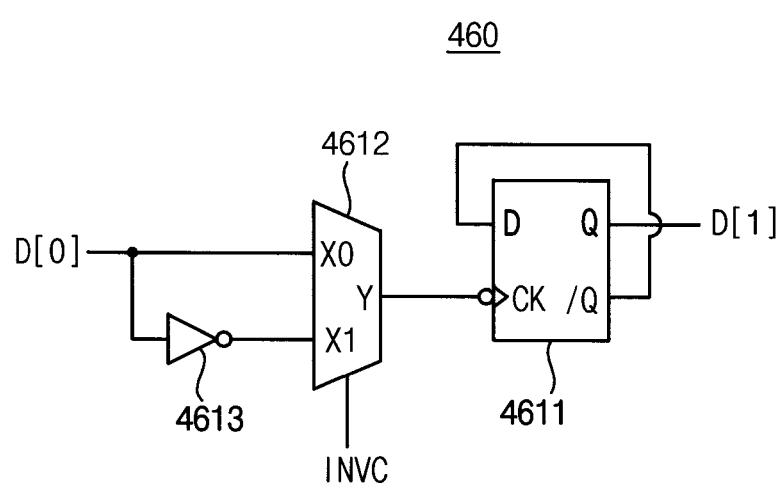
FIG. 13 illustrates one of the sub-counting units in FIG. 12.

FIG. 13 illustrates one of the sub-counting units in FIG. 12.

FIG. 13 illustrates a configuration of the sub-counting unit 460, and other sub-counting units 411, 412, 413, 461, and 462 may have substantially the same configuration as the sub-counting unit 460.

Referring to FIG. 13, the sub-counting unit 460 includes a D flip-flop 4611, a multiplexer 4612, and an inverter 4613. The inverter 4613 inverts the bit signal D[0] and the multiplexer 4612 selects one of the bit signal D[0] and an output of the inverter 4613 to provide the selected one of the bit signal D[0] and the output of the inverter 4613 to a clock terminal CK of the D flip-flop 4611 in response to the inversion control signal INVC. The D flip-flop 4611 has the clock terminal CK that receives an output Y of the multiplexer 4612, an inverted output terminal /Q fed-back to a data terminal D, and an output terminal Q providing the bit signal D[1]. Therefore, the multiplexer 4612 and the inverter 4613 perform inversion operation on the D flip-flop 4611.

Figure 14:
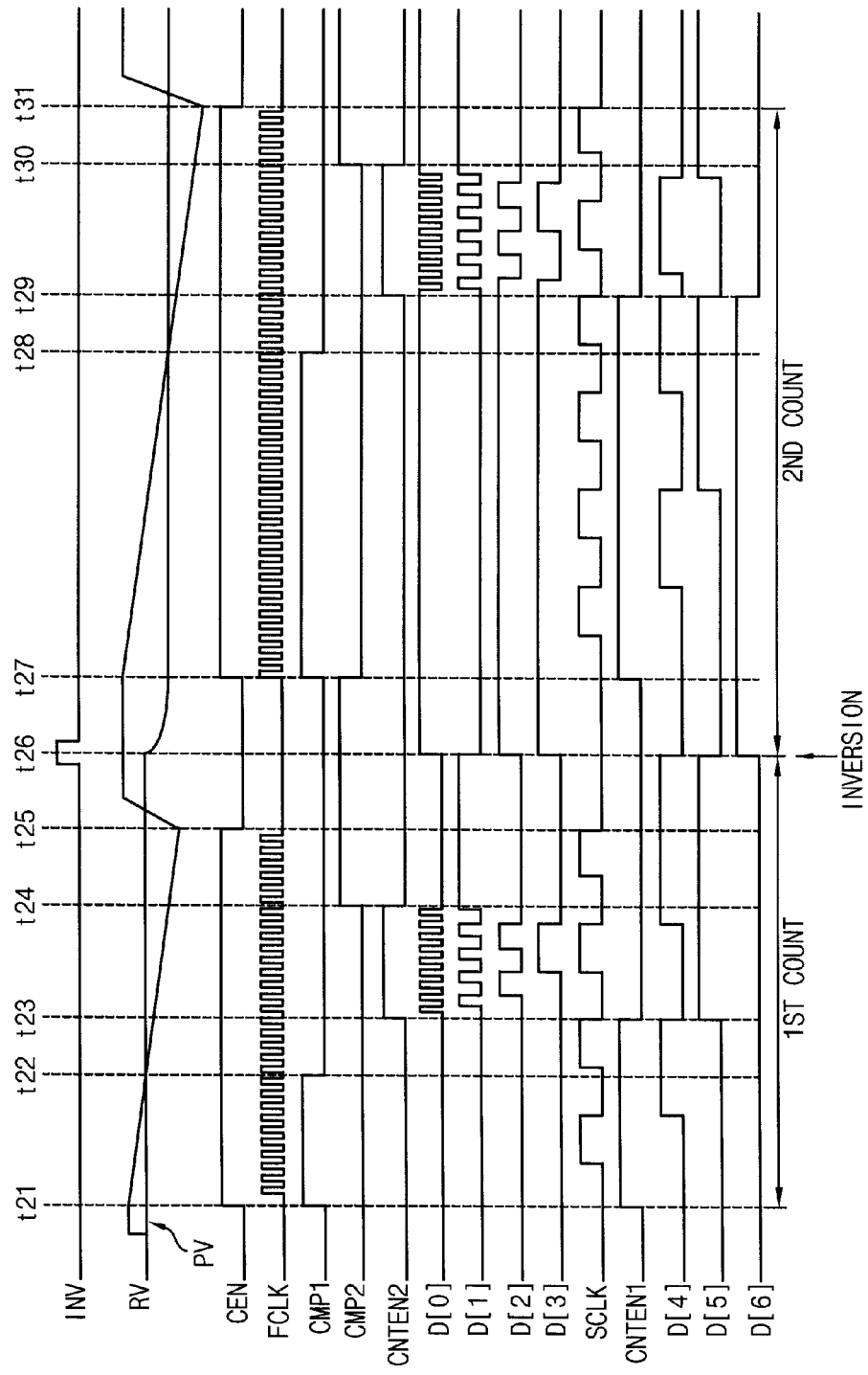
FIG. 14 is a timing diagram illustrating operation of the counter circuit of FIG. 10 according to exemplary embodiments.

FIG. 14 is a timing diagram illustrating operation of the counter circuit of FIG. 10 according to exemplary embodiments.

FIG. 14 illustrates an example in which the lower M-bit signals LBIT include four bits, when the counter circuit 200b generates a 7-bit counter output signal COUT. Since the lower M-bit signals LBIT include four bits, the second frequency of the second counter clock signal FNCLK may be 8 times higher than the first frequency of the first counter clock signal CRCLK.

Referring to FIGS. 2 and 10 through 14, the counter circuit 200b having an inversion function of FIG. 10 performs digital double sampling by performing a first counting operation 1ST COUNT that counts the first analog signal corresponding to a reset component as a digital signal, an inversion operation INVERSION that inverts first counting result, and a second counting operation 2ND COUNT that counts the second analog signal corresponding to an image signal component as a digital signal. In FIG. 14, operation of the counter circuit 200b (or CDS operation) with respect to one column line is illustrated.

The comparator 141 in the CDS block 130 compares the ramp signal RV (or the reference signal) and the pixel output voltage RV to generate the first and second comparison signals CMP1 and CMP2 to each counter circuit 200 in the counter block 160. The counter block 160 is enabled from time t21 to time t25 in response to the counter enable signal CEN, which may be included in the control signal CLT4. The first comparison signal CMP1 is maintained at a high level from the time t21 to time t22 when the ramp signal RV reaches the level of the pixel output voltage PV. The first counting enable signal CNTEN1 is enabled from the time t21 to time t23 in response to the first comparison signal CMP1 and the first input clock signal SCLK. In other words, an interval from the time t21 to the time t23 corresponds to the coarse counting interval of the first counting operation. The first counter 405 counts the first input clock signal SCLK toggling with the first clock signal to generate the upper (N−M)-bit signals D[4], D[5] and D[6] with respect to the first analog signal during the coarse counting interval.

The second counting enable signal CNTEN2 is enabled from the time t23 to time t24 as the first counting enable signal CNTEN1 is disabled at the time t23 and the second comparison signal CMP2 transitions to a high level at the time t24. In other words, an interval from the time t23 to the time t24 corresponds to the fine counting interval of the first counting operation. The second counter 450 counts the second input clock signal FCLK toggling with the second frequency to generate the lower M-bit signals D[0], D[1], D[2] and D[3] with respect to the first analog signal during the fine counting interval.

The counter enable signal CEN is disabled at the time t25, and the counter circuit 200b outputs the counter output signal COUT corresponding to '0110010' after the time t25. The counter output signal COUT corresponding to '0110010' corresponds to '50' in decimal value, which corresponds to a number of clocks of the first input clock signal FCLK during the counter enable signal CEN is enabled.

The counter output signal COUT, i.e., '0110010' is inverted and stored in the counter circuit 200b while the inversion control signal INVC is enabled with a high level around time t26.

At time t27, the counter enable signal CEN is enabled to a high level and the ramp signal generator 170 begins to decrease level of the ramp signal RV and each counter circuit 200b starts the second counting operation by unit of column. The pixel output voltage PV is provided to the comparator 141 as the second analog signal representing the image signal component. The first comparison signal CMP1 is maintained at a high level from time t27 to time t28, and the first counting enable signal CNTEN1 is enabled from the time t27 to the time t29 in response to the first comparison signal CMP1 and the first input clock signal SCLK. In other words, an interval from the time t27 to the time t29 corresponds to the coarse counting interval of the second counting operation. The first counter 405 counts the first input clock signal SCLK toggling with the first clock signal to generate the upper (N−M)-bit signals D[4], D[5] and D[6] with respect to the second analog signal during the coarse counting interval.

The second counting enable signal CNTEN2 is enabled from the time t29 to time t30 as the first counting enable signal CNTEN1 is disabled at the time t29 and the second comparison signal CMP2 transitions to a high level at the time t30. In other words, an interval from the time t29 to the time t30 corresponds to the fine counting interval of the second counting operation. The second counter 450 counts the second input clock signal FCLK toggling with the second frequency to generate the lower M-bit signals D[0], D[1], D[2] and D[3] with respect to the second analog signal during the fine counting interval.

The counter enable signal CEN is disabled at the time t31, and the counter circuit 200b outputs the counter output signal COUT corresponding to '0100011' which after the time t25. The counter output signal COUT corresponding to '0110010' which may be obtained by subtracting '0110010' counted on the first analog signal (or the reset component) from the counted number of the second input clock signal FCLK while the counter enable signal CEN is enabled during the second counting operation. The counter output signal COUT of '0110010' corresponds to '35' in decimal value, which corresponds to a value obtained by subtracting the reset component from the image signal component.

The counter circuit 200b having an inversion function described with reference to FIGS. 10 through 14, generates upper bits by counting the first counter clock signal CRCLK having a lower frequency during the coarse counting interval and generates lower bits by counting the second counter clock signal FNCLK having a higher frequency during the fine counting interval to provide the counter output signal COUT in each of the first and second counting operations. Therefore, power consumption may be greatly reduced by reducing a toggling number of the counter clock signal when compared with the related art counter. The related art counter counts one input clock signal.

FIGS. 15 through 18 are circuit diagrams of examples of unit pixel which may be included in the pixel array in FIG. 2 according to some example embodiments.

Figure 15:
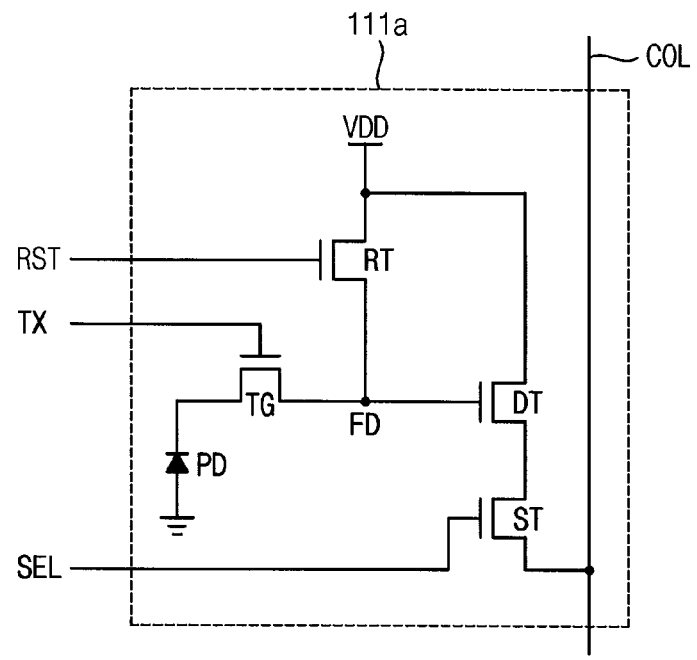
FIGS. 15 through 18 are circuit diagrams of examples of unit pixel which may be included in the pixel array in FIG. 2 according to exemplary embodiments.

Referring to FIG. 15, a unit pixel 111a includes a photo sensitive device PD, a transfer transistor TX, a floating diffusion node FD, a reset transistor RX, a drive transistor DX, and a select transistor SX.

The unit pixel 111a includes the photo sensitive device PD, the transfer transistor TX including a gate controlled by a transfer gate control signal TG to transfer a photoelectric conversion signal integrated at the photo sensitive device PD, a floating diffusion node FD storing the photoelectric conversion signal transferred through the transfer transistor TX or a reset signal, e.g., VDD transferred through a reset transistor RX including a gate controlled by a reset control signal RG, a drive transistor DX outputting a voltage of the floating diffusion node FD through a source using a source follower structure, and a select transistor SX which is turned on according to a predetermined timing to output a signal generated by the unit pixel 111a in response to a column selection signal SEL.

The photo sensitive device PD may include at least one among a photodiode, a photo transistor, a photo gate, a pinned photodiode (PPD), and a combination thereof.

FIG. 15 illustrates a unit pixel having a four transistor (4T) structure, which includes the single photo sensitive device PD and the four MOS transistors TX, RX, DX, and SX. However, the exemplary embodiments are not restricted to the current embodiments. Embodiments can be applied to any circuit including the photo sensitive device PD and at least three transistors including the drive transistor DX and the select transistor SX. Pixel cells according to different embodiments are illustrated in FIGS. 16 through 18.

Figure 16:
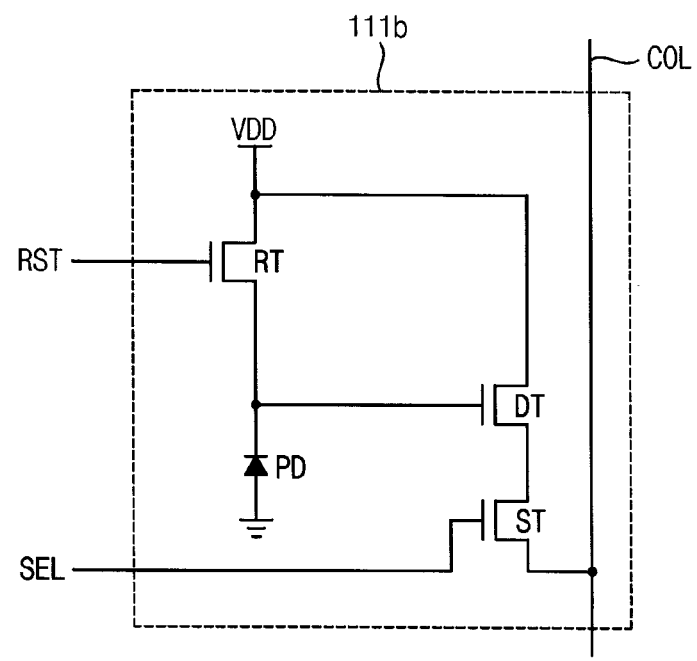

A unit pixel 111b illustrated in FIG. 16 has a three transistor (3T) structure and includes a photo sensitive device PD, a reset transistor RX, a drive transistor (or a source follower transistor) DX, and a select transistor SX.

Figure 17:
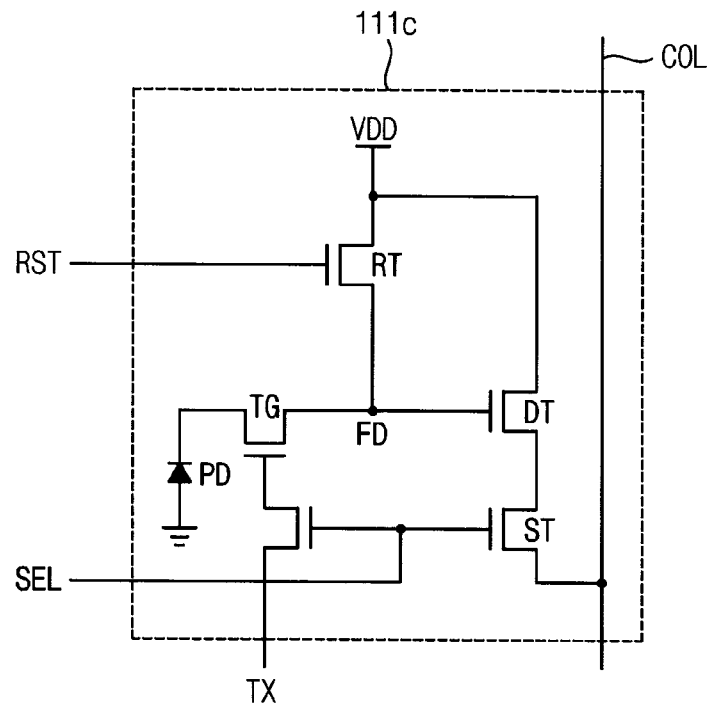

A unit pixel 111c illustrated in FIG. 17 has a five transistor (5T) structure and includes one transistor GX in addition to the photo sensitive device PD, the transfer transistor TX, the reset transistor RX, the drive transistor (or the source follower transistor) DX, and the select transistor SX.

Figure 18:
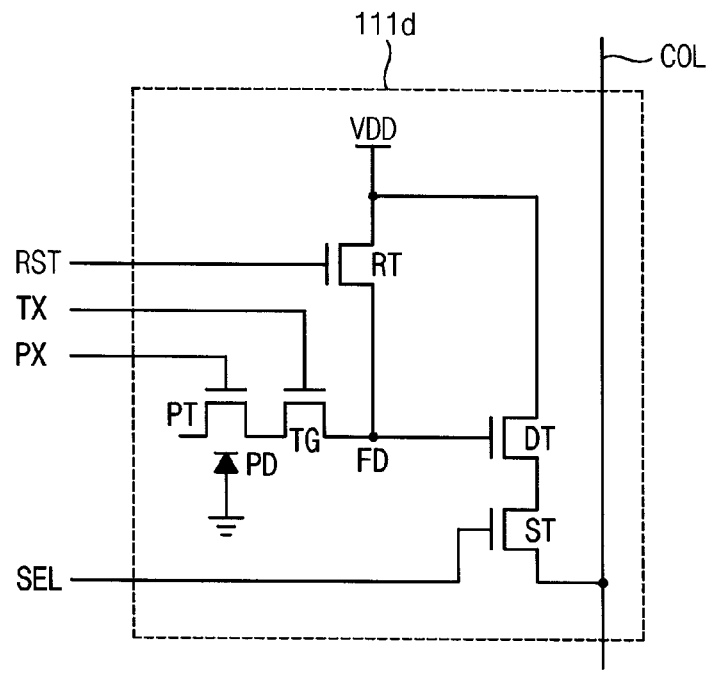

A unit pixel 111d illustrated in FIG. 18 has the 5T structure and includes two more transistors TX and PX in addition to the photo sensitive device PD, the reset transistor RX, the drive transistor (or the source follower transistor) DX, and the select transistor SX.

Various types of pixel cells as shown in FIGS. 15 through 18 may have an independent structure, as described above. However, various types of pixel cells as shown in FIGS. 15 through 18 may also share at least one element with each other. For instance, in the structure illustrated in FIG. 15, two or four pixels may include only the photo sensitive device PD and the transfer transistor TX independently, and share the other elements with one another and independently operate through timing control.

Figure 19:
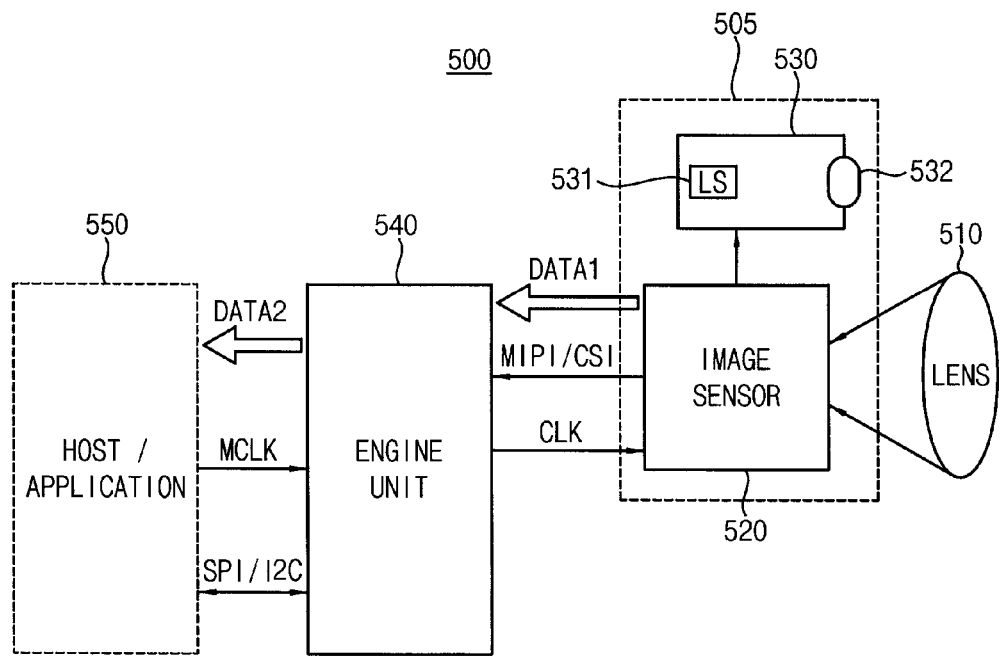
FIG. 19 is a block diagram illustrating an example of a camera including the image sensor according to exemplary embodiments.

FIG. 19 is a block diagram illustrating an example of a camera including the image sensor according to some example embodiments.

Referring to FIG. 19, a camera (also referred to as an image pick-up device) 500 includes a receiving lens 510, an image sensor chip 505, and an engine unit 540. The image sensor chip 505 may include an image sensor 520 and a light source module 530. In some embodiments, the image sensor 520 and the light source module 530 may be implemented as separate devices, or may be implemented such that at least one component of the light source module 530 is included in the image sensor 520. The image sensor 520 may employ the image sensor 101 of FIG. 2 and may include a sensing unit, a row driver, a CDS block, and ADC, a ramp signal generator, a control unit, and a buffer. The light source module 530 may include a light source 531 and a lens 532.

The ADC may include the CDS block and the counter block as illustrated in FIG. 2. The counter block may include the counter circuits 200a and 200b described with reference to FIGS. 3 through 14, and generates upper bits by counting the first counter clock signal having lower frequency during the coarse counting interval and generates lower bits by counting the second counter clock signal having higher frequency during the fine counting interval to provide the counter output signal in each of the first and second counting operations. Therefore, power consumption may be greatly reduced by reducing a toggling number of the counter clock signal when compared with the related art counter. The related art counter counts one input clock signal.

The receiving lens 510 may focus incident light on a photo-receiving region (e.g., depth pixels and/or color pixels) of the image sensor 520. The image sensor chip 520 may generate data DATA1 including depth information and/or color image information based on the incident light passing through the receiving lens 510. For example, the data DATA1 generated by the image sensor chip 520 may include depth data generated using infrared light or near-infrared light emitted by the light source module 530, and red, green, blue (RGB) data of a Bayer pattern generated using external visible light VL. The image sensor 520 may provide the data DATA1 to the engine unit 540 in response to a clock signal CLK. In some embodiments, the image sensor 520 may interface with the engine unit 540 using a mobile industry processor interface (MIPI) and/or a camera serial interface (CSI).

The engine unit 540 may control the image sensor chip 505. The engine unit 540 may process the data DATA1 received from the image sensor 520. For example, the engine unit 540 may generate color data based on the received data DATA1. In other examples, the engine unit 540 may generate luminance, chrominance (YUV) data including a luminance component (Y), a difference between the luminance component and a blue component (U), and a difference between the luminance component and a red component (V) based on the RGB data, or may generate compressed data, such as Joint Photographic Experts Group (JPEG) data. The engine unit 540 may be coupled to a host/application 550, and may provide data DATA2 to the host/application 550 based on a master clock signal MCLK. In some embodiments, the engine unit 540 may interface with the host/application 550 using a serial peripheral interface (SPI) and/or an inter integrated circuit (I2C) interface.

Figure 20A:
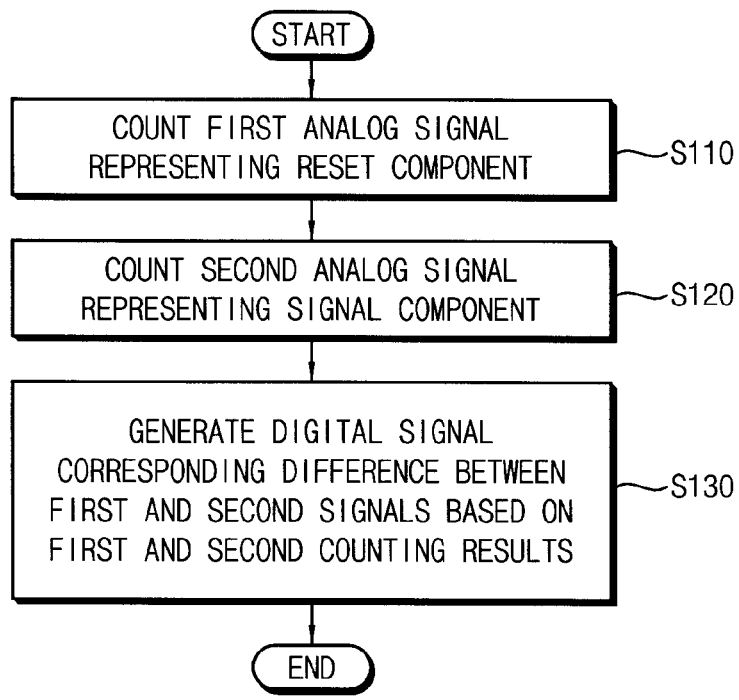
FIG. 20A is a flow chart illustrating a method of correlated double sampling according to exemplary embodiments.

FIG. 20A is a flow chart illustrating a method of correlated double sampling according to some example embodiments.

Referring to FIGS. 2 and 20A, in a first counting operation, the ADC 120 counts a first analog signal representing a reset component (S110), and in a second counting operation, counts a second analog signal representing an image signal component (S120). The ADC 120 generates a digital signal corresponding to a difference between the first and second analog signals based on results of the first and second counting operations (S130). Each of the first and second counting operations is performed according to DDR counting scheme as described above. In other words, upper bits are generated by counting the first counter clock signal having a lower frequency during the coarse counting interval and lower bits are generated by counting the second counter clock signal having a higher frequency during the fine counting interval to provide the counter output signal in each of the first and second counting operations. Therefore, power consumption may be greatly reduced by reducing a toggling number of the counter clock signal when compared with the related art counter. The related art counter counts one input clock signal.

Each counter circuit 200 stores the result of the first counting operation, performs inversion operation on the stored result, and performs the second counting operation. The counter block 160 outputs the digital signal corresponding to valid image signal compensated by CDS. The N-bit counter output signal COUT may be inverted in response to the inversion control signal INVC after the first counting operation is completed and before the second counting operation is started.

Figure 20B:
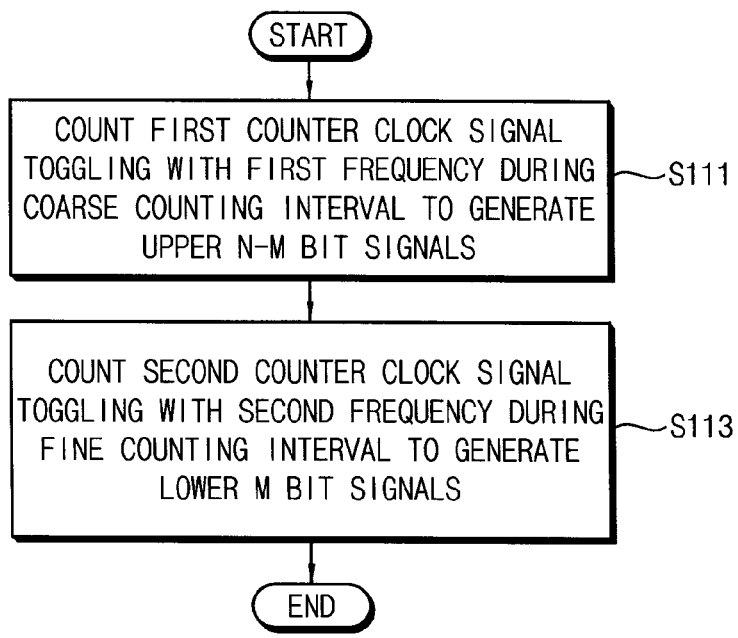
FIG. 20B is a flow chart illustrating each detailed step of the first and second counting operations according to exemplary embodiments.

FIG. 20B is a flow chart illustrating each detailed step of the first and second counting operations according to some example embodiments.

Referring to FIGS. 2 and 20B, in each of the first and second counting operations S110 and S120, the upper (N−M)-bit signals of the N-bit counter output signal corresponding to the first and second analog signals are generated by counting the first counter clock signal toggling with the first frequency during the coarse counting interval (S111), and the lower M-bit signals of the N-bit counter output signal are generated by counting the second counter clock signal toggling with the second frequency higher than the first frequency during the fine counting interval after the coarse counting interval (S113). Steps S111 and S113 are substantially the same as the operation of the counter circuit 200 with reference to FIGS. 3 through 14.

Figure 21:
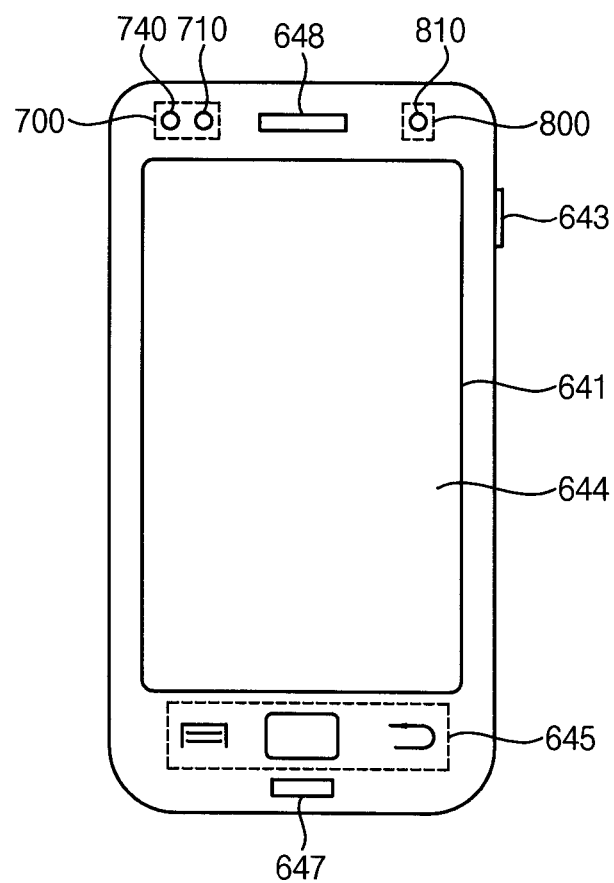
FIG. 21 is a plan view illustrating a mobile device according to exemplary embodiments.

FIG. 21 is a plan view illustrating a mobile device according to some example embodiments.

Referring to FIG. 21, the mobile device 600 includes a 3D image sensor 700, a 2D image sensor 800, and a display device 641. The mobile device 600 may further include a touch screen 644, buttons 643 and 645, a microphone 647, and a speaker 648.

The 3D image sensor 700 is installed on a first surface (e.g., a front surface) of the mobile device 600. The 3D image sensor 700 performs a first sensing to detect a proximity of a subject and a second sensing to recognize a gesture of the subject by acquiring a distance information for the subject. The 3D image sensor 700 may include a sensing unit 710 having a plurality of depth pixels and a light source unit 740 to emit infrared ray or near-infrared ray.

The 2D image sensor 800 is installed on the first surface of the mobile device 600 and performs a third sensing to acquire color image information for the subject. The 2D image sensor 800 may include a second sensing unit 810 having a plurality of color pixels.

In the example embodiment of FIG. 21, the 3D image sensor 700 and the 2D image sensor 800 may be prepared as two integrated circuit chips separated from each other. In other words, the mobile device 600 may include two sensing modules. In this case, the depth pixels and the color pixels may constitute two pixel arrays separated from each other.

The display device 641 is installed on the first surface of the mobile device 600 to display the results of the first sensing, the second sensing, and the third sensing.

Figure 22:
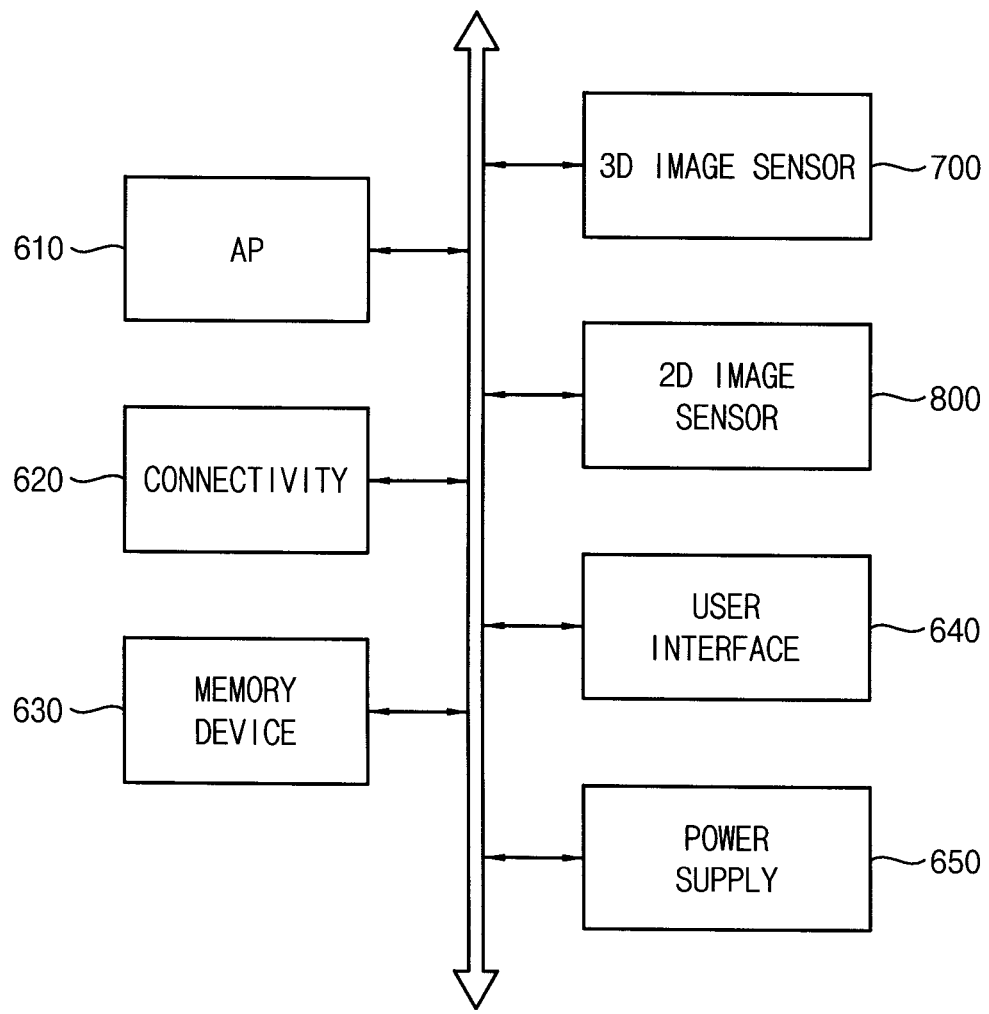
FIG. 22 is a block diagram illustrating the mobile device shown in FIG. 21.

FIG. 22 is a block diagram illustrating the mobile device shown in FIG. 21.

Referring to FIG. 22, the mobile device 600 includes an application processor 610, a connectivity unit 620, a memory device 630, a 3D image sensor 700, a 2D image sensor 800, a user interface 640, and a power supply 650. According to example embodiments, the mobile device 600 may be a predetermined mobile system, such as a mobile phone, a smart phone, a tablet PC, a laptop computer, a PDA (Personal Digital Assistant), a PMP (Portable Multimedia Player), a digital camera, a music player, a portable game console, or a navigation system.

The application processor 610 may execute an operating system (OS) to operate the mobile device 600. In addition, the application processor 610 may execute various applications to provide an internet browser, a game, and a dynamic image. According to example embodiments, the application processor 610 may include a single core or multi-cores. In addition, according to example embodiments, the application processor 610 may further include a cache memory positioned inside or outside the application processor 610.

The connectivity unit 620 can make a communication with external devices. For instance, the connectivity unit 620 can perform the USB (Universal Serial Bus) communication, Ethernet communication, NFC (Near Field Communication), RFID (Radio Frequency Identification) communication, mobile telecommunication or memory card communication. For instance, the connectivity unit 620 may include a baseband chipset and may support communications such as GSM, GPRS, WCDMA and HSxPA.

The memory device 630 may store data processed by the application processor 1010, or may operate as a working memory. In addition, the memory device 630 may store a bottom image for booting the mobile device 600, a file system related to the operating system to operate the mobile device 600, a device driver related to external devices connected to the mobile device 600, and the applications executed in the mobile device 600. For instance, the memory device 630 may include a volatile memory, such as DRAM (Dynamic Random Access Memory), SRAM (Static Random Access Memory), mobile DRAM, DDR SDRAM, LPDDR SDRAM, GDDR SDRAM or RDRAM, or may include a nonvolatile memory, such as EEPROM (Electrically Erasable Programmable Read-Only Memory), Flash Memory, PRAM (Phase Change Random Access Memory), RRAM (Resistance Random Access Memory), NFGM (Nano Floating Gate Memory), PoRAM (Polymer Random Access Memory), MRAM (Magnetic Random Access Memory), or FRAM (Ferroelectric Random Access Memory).

The 3D image sensor 700 may perform the first sensing and the second sensing. The 2D image sensor 800 may perform the third sensing The user interface 640 may include at least one input device, such as a keypad, the buttons 643 and 645 or the touch screen 644, and/or at least one output device, such as the speaker 648 or the display device 641. The power supply 650 may supply an operating voltage to the mobile system 600.

The mobile device 600 or components of the mobile device 600 may be mounted by using various types of packages, such as PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package), and WSP (Wafer-Level Processed Stack Package).

Figure 23:
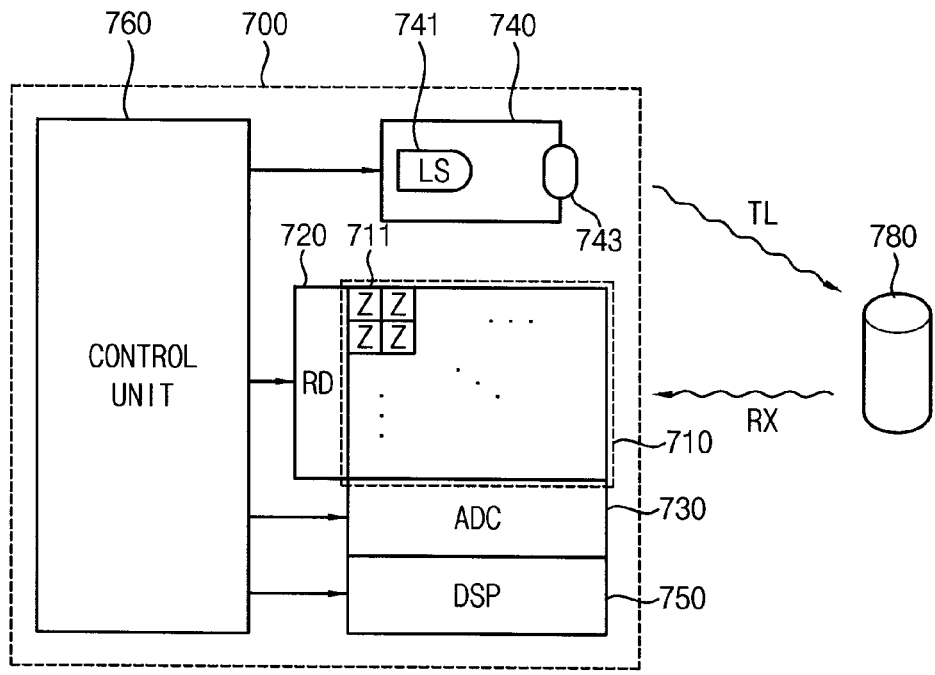
FIG. 23 is a block diagram illustrating an example of the 3D image sensor included in the mobile device shown in FIG. 21.

FIG. 23 is a block diagram illustrating an example of the 3D image sensor included in the mobile device shown in FIG. 21.

Referring to FIG. 23, the 3D image sensor 700 may include a sensing unit 710, an RD (row driving) unit 720, an ADC (Analog-to-Digital Converting) unit 730, a light source unit 740, a DSP (Digital Signal Processing) unit 750, and a control unit 760.

The light source unit 740 may output light TL having a predetermined wavelength (e.g., infrared ray or near-infrared ray). The light source unit 740 may be selectively activated or may emit lights having mutually different brightness according to the operation mode.

The light source unit 740 may include a light source 741 and a lens 743. The light source 741 may generate the light TL. For instance, the light source 741 may be realized as an LED (light emitting diode) or a laser diode. In one example embodiment, the light source 741 may generate light having intensity modulated to be periodically changed. For instance, the intensity of the light TL may be modulated in the form of a pulse wave having continuous pulses, such as a sine wave or a cosine wave. In another example embodiment, the light source 741 may generate light having constant intensity, i.e., non-modulated light. The lens 741 can concentrate the light TL emitted from the light source 741 onto a subject 780.

The sensing unit 710 receives light RX reflected from the subject 780 to convert the light RX into an electric signal. In one example embodiment, the received light RX may be generated based on infrared ray or near-infrared ray TL emitted from the light source unit 140. In another example embodiment, the received light RX may be generated based on infrared ray or near-infrared ray included in ambient light. In still another example embodiment, the received light RX may be generated based on visible ray included in the ambient light. In still yet another example embodiment, the received light RX may be generated based on both infrared ray or near-infrared ray and visible ray.

The sensing unit 710 may include a plurality of depth pixels 711. All or part of the depth pixels 711 may be activated according to the operation mode. The depth pixels 711 are aligned in the form of a pixel array and provide information about the distance between the 3D image sensor 700 and the subject 780. For instance, an infrared filter or a near-infrared filter may be formed on the depth pixels 711. In the depth pixels 711, at least one of the first and second portions of the transfer gate in a longitudinal direction is not overlapped with the isolation region. Therefore generation of noisy electrons is suppressed to enhance dark characteristic.

The row driving unit 720 is connected to each row of the sensing unit 710 to generate a driving signal to drive each row. For instance, the row driving unit 720 can drive the depth pixels 711, which are included in the sensing unit 710, in a row unit.

The ADC unit 730 is connected to each column of the sensing unit 710 to convert an analog signal output from the sensing unit 710 into a digital signal. In one example embodiment, the ADC unit 730 includes a plurality of analog-digital converters and can perform the column ADC to convert the analog signals output from each column line into the digital signals in parallel (i.e., concurrently). In another example embodiment, the ADC unit 730 includes a single analog-digital converter and can perform the single ADC to sequentially convert the analog signals into the digital signals.

According to example embodiments, the ADC unit 730 may include a CDS (Correlated Double Sampling) unit to extract effective signal components. In one example embodiment, the CDS unit may perform the analog double sampling to extract the effective signal components based on difference between an analog reset signal representing a reset component and an analog data signal representing a signal component. In another example embodiment, the CDS unit may perform the digital double sampling to extract the effective signal components based on difference between two digital signals after converting the analog reset signal and the analog data signal into the two digital signals. In still another example embodiment, the CDS unit may perform the dual correlated double sampling by performing both the analog double sampling and the digital double sampling. The ADC unit 730 includes a plurality of counter circuits, and each of the counter circuits may employ the counter circuit 200*a* of FIG. 3 or the counter circuit 200*b* of FIG. 10. Therefore, each counter circuit generates upper bits by counting the first counter clock signal having a lower frequency during the coarse counting interval and generates lower bits by counting the second counter clock signal having a higher frequency during the fine counting interval to provide the counter output signal in each of a first counting operation that counts a first analog signal corresponding to a reset component and a second counting operation that counts a second analog signal corresponding to an image signal component. Therefore, power consumption may be greatly reduced by reducing a toggling number of the counter clock signal when compared with the related art counter. The related art counter counts one input clock signal.

The DSP unit 750 receives the digital signal output from the ADC unit 730 to perform the image data processing with respect to the digital signal. For instance, the DSP unit 750 may perform the image interpolation, color correction, white balance, gamma correction, and color conversion.

The control unit 760 may control the row driving unit 720, the ADC unit 730, the light source unit 740, and the DSP unit 750. The control unit 760 may supply control signals, such as clock signals and timing control signals required to operate the row driving unit 720, the ADC unit 730, the light source unit 740, and the DSP unit 750. In one example embodiment, the control unit 760 may include a logic control circuit, a PLL (Phase Lock Loop) circuit, a timing control circuit, and a communication interface circuit.

Figure 24:
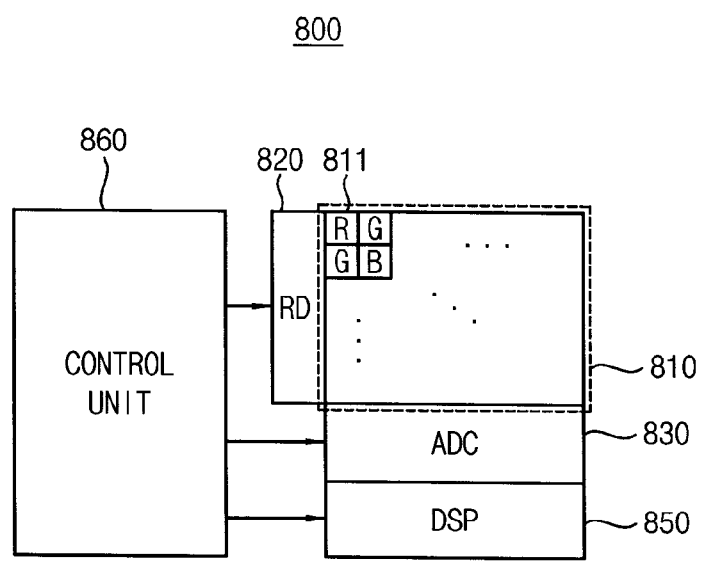
FIG. 24 is a block diagram illustrating an example of the 2D image sensor included in the mobile device shown in FIG. 21.

FIG. 24 is a block diagram illustrating an example of the 2D image sensor included in the mobile device shown in FIG. 21.

Referring to FIG. 24, the 2D image sensor 800 may include a sensing unit 810, a row driving unit 820, an ADC (Analog-to-Digital Converting) unit 830, a DSP (Digital Signal Processing) unit 850, and a control unit 860.

The sensing unit 810 may convert incident light (e.g., visible ray) into an electric signal. The sensing unit 810 may include a plurality of color pixels 811. The color pixels 811 are aligned in the form of a pixel array and provide information about the color image for the subject. For instance, a red filter, a green filter, and a blue filter may be formed on the color pixels 811. In another example embodiment, a yellow filter, a cyan filter, and a magenta filter may be formed on the color pixels 811. In the color pixels, at least one of the first and second portions of the transfer gate in a longitudinal direction is not overlapped with the isolation region. Therefore, generation of noisy electrons is suppressed to enhance dark characteristic.

The row driving unit 820 is connected to each row of the second sensing unit 810 to generate a driving signal to drive each row. The ADC unit 830 is connected to each column of the second sensing unit 810 to convert an analog signal output from the second sensing unit 810 into a digital signal. According to example embodiments, the ADC unit 830 may include a CDS (Correlated Double Sampling) unit to extract effective signal components. The DSP unit 850 receives the digital signal output from the ADC unit 830 to perform the image data processing with respect to the digital signal. The control unit 860 may control the row driving unit 820, the ADC unit 830, and the DSP unit 850.

The ADC unit 860 includes a plurality of counter circuits, and each of the counter circuits may employ the counter circuit 200a of FIG. 3 or the counter circuit 200b of FIG. 10. Therefore, each counter circuit generates upper bits by counting the first counter clock signal having a lower frequency during the coarse counting interval and generates lower bits by counting the second counter clock signal having a higher frequency during the fine counting interval to provide the counter output signal in each of a first counting operation that counts a first analog signal corresponding to a reset component and a second counting operation that counts a second analog signal corresponding to an image signal component. Therefore, power consumption may be greatly reduced by reducing a toggling number of the counter clock signal when compared with the related art counter. The related art counter counts one input clock signal.

Figure 25:
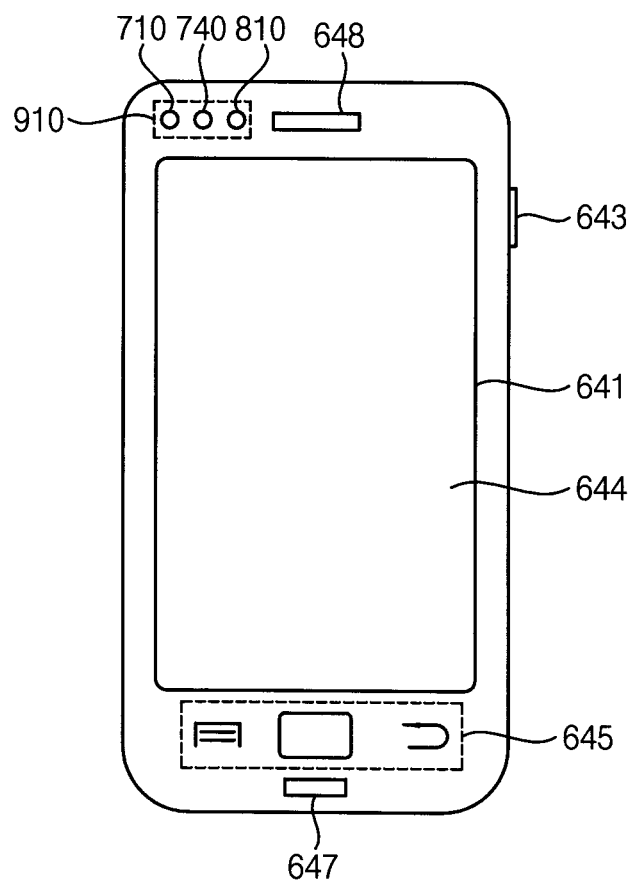
FIG. 25 is a plan view illustrating the mobile device according to exemplary embodiments.

FIG. 25 is a plan view illustrating the mobile device according to some example embodiments.

Referring to FIG. 25, the mobile device 900 includes an image sensor 910 and a display device 641. The mobile device 900 may further include a touch screen 644, buttons 643 and 645, a microphone 647 and a speaker 648.

The image sensor 910 is installed on a first surface (e.g., a front surface) of the mobile device 900. The image sensor 910 performs a first sensing to detect proximity of a subject, a second sensing to recognize a gesture of the subject by acquiring distance information for the subject, and a third sensing to acquire color image information for the subject. The image sensor 910 may include a first sensing unit 710 having a plurality of depth pixels, a light source unit 740 to emit infrared ray or near-infrared ray and a second sensing unit 810 having a plurality of color pixels.

In the example embodiment of FIG. 25, a 3D image sensor and a 2D image sensor may be prepared as one integrated circuit chip. In other words, the mobile device 900 may include one sensing module. In this case, the depth pixels and the color pixels may constitute two pixel arrays separated from each other. In the depth pixels and the color pixels, at least one of the first and second portions of the transfer gate in a longitudinal direction is not overlapped with the isolation region. Therefore, generation of noisy electrons is suppressed to enhance dark characteristic.

The display device 641 is installed on the first surface of the mobile device 900 to display the results of the first sensing, the second sensing, and the third sensing.

The mobile device 900 of FIG. 25 is substantially identical to the mobile device 600 of FIG. 21, except that the 3D image sensor and the 2D image sensor of the mobile device 900 are prepared as one integrated circuit chip.

Figure 26:
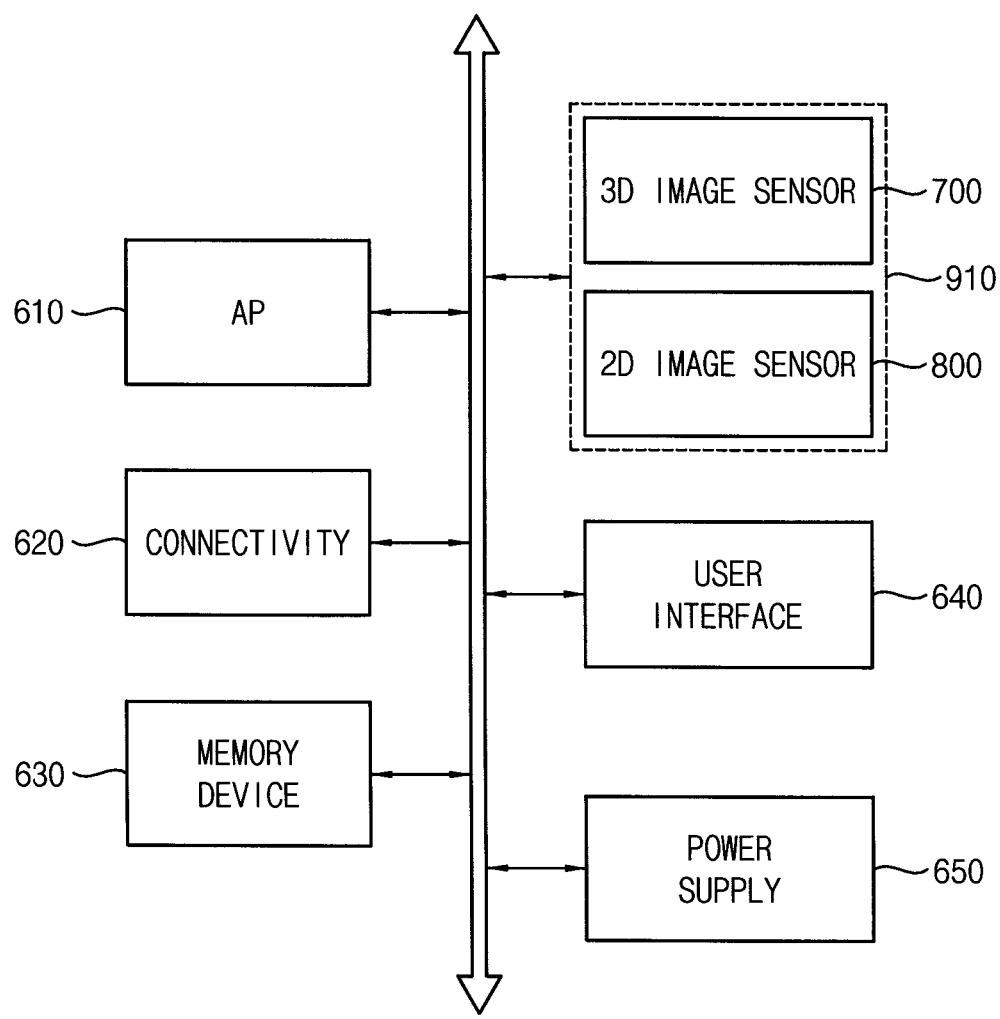
FIG. 26 is a block diagram illustrating an example of the mobile device shown in FIG. 25.

FIG. 26 is a block diagram illustrating an example of the mobile device shown in FIG. 25.

Referring to FIG. 26, the mobile device 900 includes an application processor 610, a connectivity unit 620, a memory device 630, an image sensor 910, a user interface 640, and a power supply 650.

When comparing with the mobile device 600 of FIG. 22, the mobile device 900 of FIG. 26 may further include the image sensor 910 in which the 3D image sensor 700 and the 2D image sensor 800 are integrated.

The image sensor 910 may perform the first sensing, the second sensing, and the third sensing. For instance, the image sensor 910 may primarily perform the first sensing and at least one of the second sensing and the third sensing may be performed based on the results of the first sensing.

Figure 27:
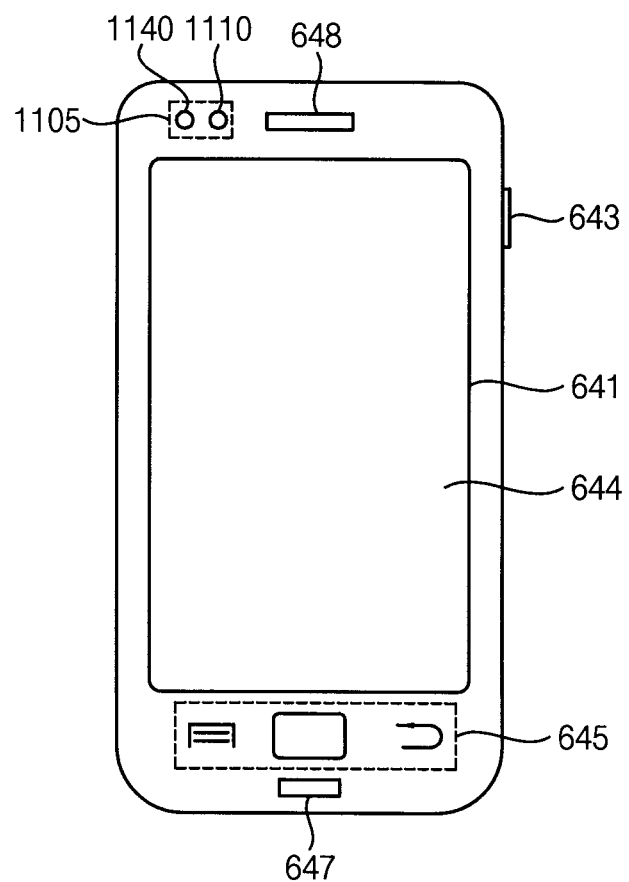
FIG. 27 is a plan view illustrating the mobile device according to exemplary embodiments.

FIG. 27 is a plan view illustrating the mobile device according to example embodiments.

Referring to FIG. 27, the mobile device 1100 includes an image sensor 1105 and a display device 641. The mobile device 1100 may further include a touch screen 644, buttons 643 and 645, a microphone 647 and a speaker 648.

The image sensor 1105 is installed on a first surface (e.g., a front surface) of the mobile device 1100. The image sensor 1105 performs a first sensing to detect a proximity of a subject, a second sensing to recognize a gesture of the subject by acquiring distance information for the subject, and a third sensing to acquire color image information for the subject. The image sensor 1105 may include a sensing unit 1110 having a plurality of depth pixels and color pixels and a light source unit 1140 to emit infrared ray or near-infrared ray.

In the example embodiment of FIG. 27, a 3D image sensor and a 2D image sensor may be prepared as one integrated circuit chip. In other words, the mobile device 1100 may include one sensing module. In this case, the depth pixels and the color pixels may constitute one pixel array. In detail, the image sensor 1105 may be a 3D color image sensor, e.g., an RGBZ sensor. In the depth pixels and the color pixels, at least one of the first and second portions of the transfer gate in a longitudinal direction is not overlapped with the isolation region. Therefore, generation of noisy electrons is suppressed to enhance dark characteristic.

The display device 641 is installed on the first surface of the mobile device 1100 to display the results of the first sensing, the second sensing, and the third sensing.

The mobile device 1100 of FIG. 27 is substantially identical to the mobile device 600 of FIG. 21 except that the 3D image sensor and the 2D image sensor of the mobile device 1100 are prepared as one integrated circuit chip, and the depth pixels and the color pixels constitute one pixel array.

Figure 28:
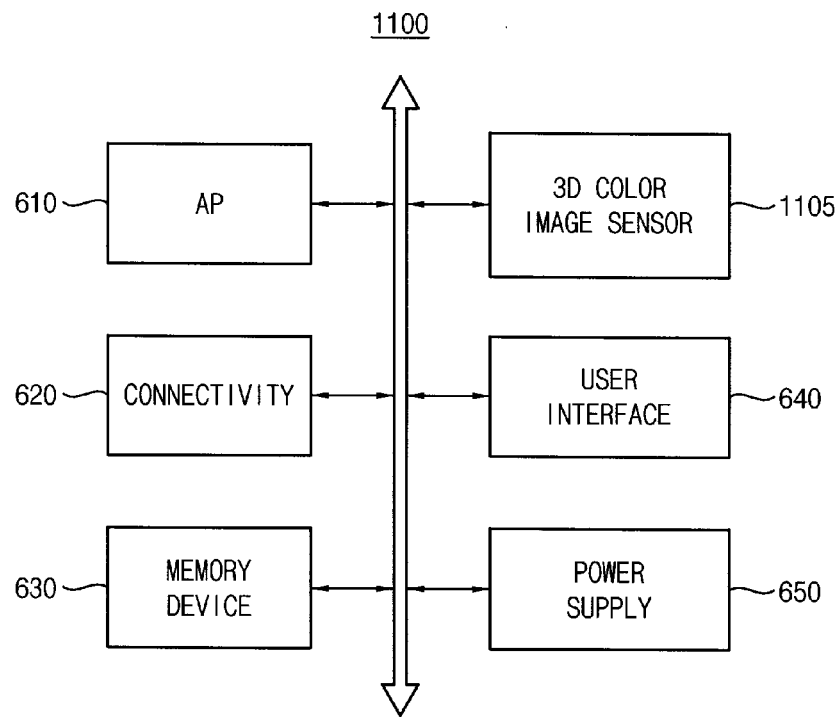
FIG. 28 is a block diagram illustrating an example of the mobile device shown in FIG. 33.

FIG. 28 is a block diagram illustrating an example of the mobile device shown in FIG. 27.

Referring to FIG. 28, the mobile device 1100 includes an application processor 610, a connectivity unit 620, a memory device 630, an image sensor 1105, a user interface 640, and a power supply 650.

When comparing with the mobile device 600 of FIG. 22, the mobile device 1100 of FIG. 28 may further include the 3D color image sensor 1105 in which the 3D image sensor and the 2D image sensor are integrated, and a plurality of depth pixels and color pixels constitute one pixel array.

The image sensor 1105 may perform the first sensing, the second sensing, and the third sensing. For instance, the image sensor 1105 may primarily perform the first sensing, and at least one of the second sensing and the third sensing may be performed based on the result of the first sensing.

Figure 29:
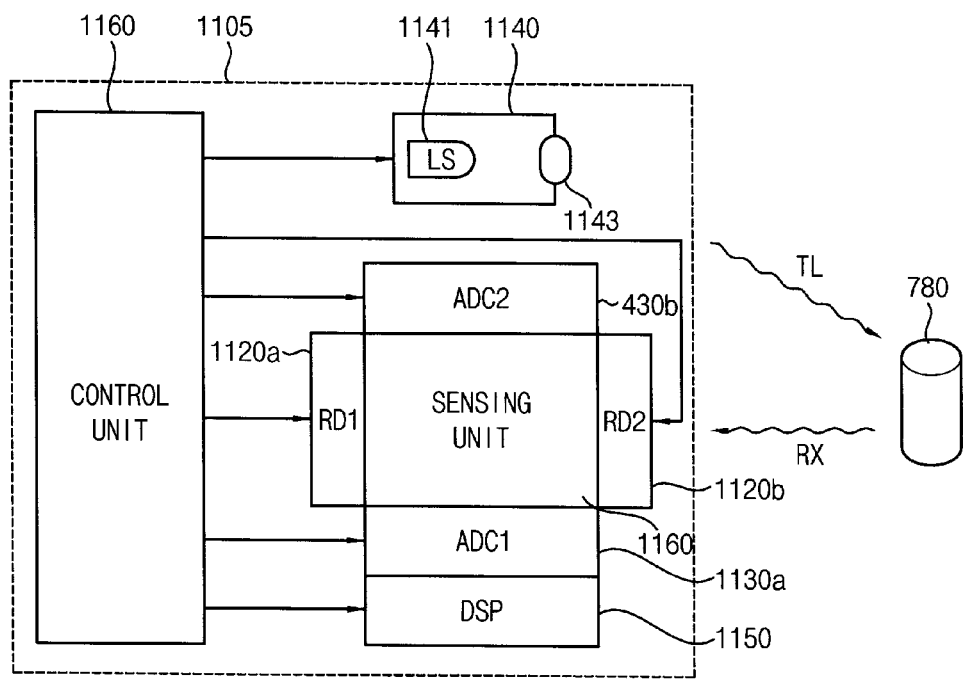
FIG. 29 is a block diagram illustrating an example of the image sensor included in the mobile device shown in FIG. 28.
Figure 30:
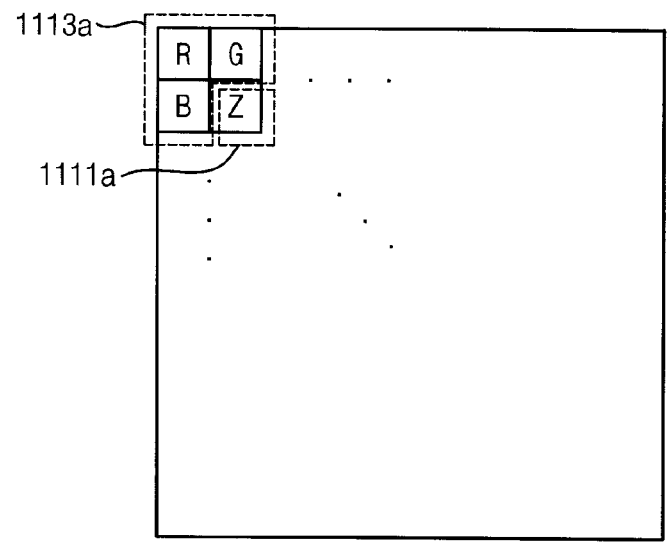
FIGS. 30 and 31 are views illustrating examples of sensing units included in the image sensor shown in FIG. 29.
Figure 31:
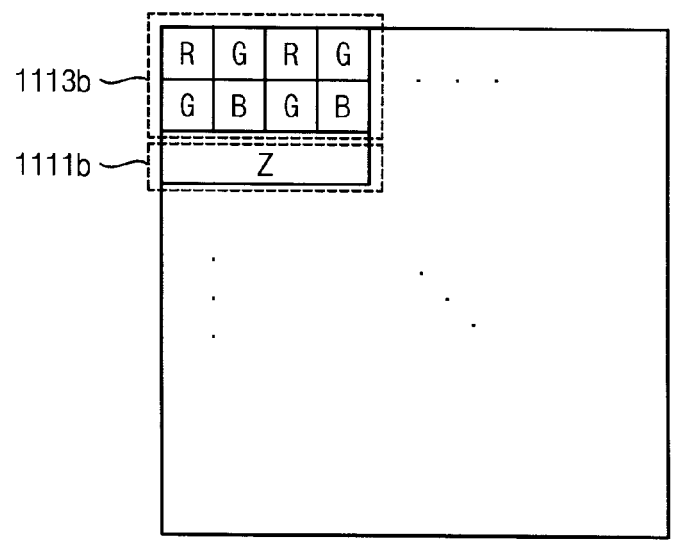

FIG. 29 is a block diagram illustrating an example of the image sensor included in the mobile device shown in FIG. 28. FIGS. 30 and 31 are views illustrating examples of sensing units included in the image sensor shown in FIG. 29.

Referring to FIG. 29, the image sensor 1105 may include a sensing unit 1110, a first row driving unit 1120a, a first ADC (Analog-to-Digital Converting) unit 1130a, a second ADC unit 1130b, a light source unit 1140, a DSP (Digital Signal Processing) unit 1150, and a control unit 1160.

The light source unit 1140 may output light TL having a predetermined wavelength (e.g., infrared ray or near-infrared ray). The light source unit 1140 may be selectively activated or emit lights having mutually different brightness according to the operation mode. The light source unit 1140 may include a light source 1141 to generate the light TL and a lens 1143 to concentrate the light onto the subject 780.

The sensing unit 1110 may provide distance information by receiving light RX reflected from the subject 780 and converting the light RX into an electric signal. In addition, the sensing unit 1110 may provide color image information by converting incident light (e.g., visible ray) into an electric signal.

The sensing unit 1110 may include a plurality of depth pixels and color pixels. According to example embodiments, the depth pixels and color pixels may be included in the sensing unit 1110 with various number ratios and size ratios. For instance, a sensing unit 1110a may include depth pixels 1111a and color pixels 1113a (as shown in FIG. 30) or a sensing unit 1110b may include depth pixels 1111b and color pixels 1113b (as shown in FIG. 31). In one example embodiment, an infrared filter (or near-infrared filter) is formed over the depth pixels and color filters (e.g., red, green, and blue filters) are formed over the color pixels. In the depth pixels and the color pixels, at least one of the first and second portions of the transfer gate in a longitudinal direction is not overlapped with the isolation region. Therefore, generation of noisy electrons is suppressed to enhance dark characteristic.

The first row driving unit 1120a is connected to each row of the color pixels and may generate a first driving signal to drive each row of the color pixels. The second row driving unit 1120b is connected to each row of the depth pixels and may generate a second driving signal to drive each row of the depth pixels. The first ADC unit 1130a is connected to each column of the color pixels and may convert a first analog signal output from each column of the color pixels into a first digital signal. The second ADC unit 1130b is connected to each column of the depth pixels and may convert a second analog signal output from each column of the depth pixels into a second digital signal. The DSP unit 1150 receives the first and second digital signals output from the first and second ADC units 1130a and 1130b to perform the image data processing with respect to the first and second digital signals. The control unit 1160 may control the first row driving unit 1120a, the second row driving unit 1120b, the first ADC unit 1130a, the second ADC unit 1130b, the light source unit 1140, and the DSP unit 1150.

Each of the first and second ADC units 1130a and 1130b includes a plurality of counter circuits, and each of the counter circuits may employ the counter circuit 200a of FIG. 3 or the counter circuit 200b of FIG. 10. Therefore, each counter circuit generates upper bits by counting the first counter clock signal having a lower frequency during the coarse counting interval and generates lower bits by counting the second counter clock signal having a higher frequency during the fine counting interval to provide the counter output signal in each of a first counting operation that counts a first analog signal corresponding to a reset component and a second counting operation that counts a second analog signal corresponding to an image signal component. Therefore, power consumption may be greatly reduced by reducing a toggling number of the counter clock signal when compared with the related art counter. The related art counter counts one input clock signal.

FIG. 32 is a block diagram illustrating an example of an interface used in the mobile device according to example embodiments.

Referring to FIG. 32, the mobile device 2000 may be implemented as a data processing device (e.g., a portable phone, a personal digital assistant, a portable multimedia player, or a smart phone) that uses or supports an MIPI interface, and may include an application processor 2110, an image sensor 2140, and a display 2150.

A CSI host 2112 of the application processor 2110 can make serial communication with a CSI device 2141 of the image sensor 2140 through a camera serial interface (CSI). In one embodiment, the CSI host 2112 may include an optical serializer DES and the CSI device 2141 may include an optical serializer SER. A DSI host 2111 of the application processor 2110 can make serial communication with a DSI device 2151 of the display 2150 through a display serial interface (DSI). In one embodiment, the DSI host 2111 may include an optical serializer SER and the DSI device 2151 may include an optical serializer DES.

In addition, the mobile device 2000 may further include an RF (i.e., radio frequency) chip 2160 which can make communication with the application processor 2110. Data may be transceived between a PHY 2113 of the mobile device 2000 and a PHY 2161 of the RF chip 2160 according to the MIPI (Mobile Industry Processor Interface) DigRF. In addition, the application processor 2110 may further include a DigRF MASTER 2114 to control data transmission according to the MIPI DigRF and the RF chip 2160 may further include a DigRF SLAVE 2162 which is controlled by the DigRF MASTER 2114.

The mobile device 2000 may also include a GPS (Global Positioning System) 2120, a storage 2170, a microphone 2180, a DRAM (Dynamic Random Access Memory) 2185, and a speaker 2190. In addition, the mobile device 2000 can perform the communication using a UWB (Ultra WideBand) 2210, a WLAN (Wireless Local Area Network) 2220, and a WIMAX (Worldwide Interoperability for Microwave Access) 2230. The structure and the interface of the mobile device 2000 are for illustrative purposes only, and example embodiments may not be limited thereto.

As described above, the counter circuit counts counter clock signals having a different frequency in each of a coarse counting interval and a fine counting interval to provide counter output signals, Thus, power consumption may be greatly reduced by reducing a toggling number of the counter clock signal.

Example embodiments can be applied to the 3D image sensor capable of performing proximity sensing and gesture recognition and the mobile system including the same. For instance, example embodiments can be applied to various terminals, such as a mobile phone, a smart phone, a tablet PC, a laptop computer, a personal digital assistant (PDA), a portable multimedia player (PMP), a digital camera, a music player, a portable game console and a navigation.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the exemplary embodiments. Accordingly, all such modifications are intended to be included within the scope of the exemplary embodiments as defined in the claims. Therefore, it is to be understood that the foregoing is illustrative of various example embodiments and is not to be construed as limited to the specific example embodiments disclosed. Therefore, modifications to the disclosed example embodiments, as well as other example embodiments, are intended to be included within the scope of the appended claims.

What is claimed is:

1. A counter circuit comprising:
a first counter which is configured to count a first counter clock signal which toggles with a first frequency to generate upper (N−M)-bit signals of N-bit counter output signals, in response to a first counting enable signal based on a first comparison signal during a coarse counting interval; and
a second counter which is configured to count a second counter clock signal which toggles with a second frequency which is higher than the first frequency to generate lower M-bit signals of the N-bit counter output signals, in response to a second counting enable signal based on the first comparison signal and a second comparison signal during a fine counting interval which follows the coarse counting interval,
wherein N and M are natural numbers, N is greater than M, and M is greater than or equal to 3.

2. The counter circuit of claim 1, wherein the second frequency is $2^{(M-1)}$ times or $2^{(M-2)}$ times higher than the first frequency and wherein the first counter comprises:
a switching unit which is configured to select one of a most significant bit (MSB) signal of the lower M-bit signals and the first counter clock signal in response to the first counting enable signal; and
a first counting unit which is connected to the switching unit,
wherein the first counting unit is configured to be disconnected from the second counter during the coarse counting interval, be connected to the second counter during the fine counting interval and generate the upper (N−M)-bit signals.

3. The counter circuit of claim 1, wherein the first counting unit comprises a plurality of D flip-flops which are configured to generate the upper (N−M)-bit signals, wherein the plurality of D flip-flops are configured to be connected to one of the MSB signal and the first counter clock signal in response to the first counting enable signal, and
wherein each of the D flip-flops comprises:
an inverted output terminal which is fed back to a data terminal;
a clock terminal which receives an adjacent low bit signal; and
an output terminal which provides each of the upper (N−M)-bit signals,
the first counting unit is further configured to be connected to the second counter during the fine counting interval, and
wherein the first counting unit operates as a ripple counter.

4. The counter circuit of claim 1, wherein the second counter is configured to count the second counter clock signal during the fine counting interval,
wherein the fine counting interval is enabled in response to the coarse counting interval transitioning to a disabled state,
wherein the second counter comprises:
a latch which is configured to latch a least significant bit (LSB) of the upper M-bit signals in response to a latch control signal;
an exclusive OR gate which is configured to perform an exclusive OR operation on an output of the latch and the second counter clock signal;
a first D flip-flop which comprises a data terminal for receiving the output of the latch, a clock terminal for receiving the second counting enable signal, and an output terminal that provides the LSB; and
a plurality of second D flip-flops which are configured to be connected to the first D flip-flop, the plurality of second D flip-flops are further configured to generate the (second through Mth)-bit signals, and
wherein each of the second D flip-flops comprises:
an inverted output terminal which is fed back to a data terminal;
a clock terminal which receives an adjacent low bit signal; and
an output terminal which provides each of the (second through Mth)-bit signals.

5. The counter circuit of claim 1, further comprising:
a counter control logic which is configured to generate the first counting enable signal, the first counter clock signal, the second counting enable signal, and the second counter clock signal based on the first comparison signal, the second comparison signal, a first input clock signal having the first frequency, and a second input clock signal having the second frequency,
wherein the first comparison signal is inverted and delayed in comparison to the second comparison signal, and
wherein the counter control logic comprises:
a first control section which is configured to generate the first counting enable signal and the first counter clock signal based on the first comparison signal and the first input clock signal; and
a second control section which is configured to generate the second counting enable signal and the second counter clock signal based on the first comparison signal, the second comparison signal, the second input clock signal, and the first counting enable signal.

6. The counter circuit of claim 5, wherein the first control section is further configured to generate the first counting enable signal such that the first counting enable signal is enabled during the coarse counting interval which includes a first interval and a second interval, the first interval comprises a first time during which the first comparison signal is enabled, and the second interval includes at least one falling edge of the first counter clock signal which does not overlap with the first interval after the first comparison signal is disabled.

7. The counter circuit of claim 5, wherein the second control section is further configured to generate the second counting enable signal such that the second counting enable signal is enabled during the fine counting enable interval which includes an interval from a second time when the coarse counting interval is disabled to a third time when the second comparison signal is enabled.

8. The counter circuit of claim 1, wherein a bit number of the lower M-bit signals is varied in response to at least one bit control signal, and
wherein the second counter further comprises:
a multiplexer which is configured to provide one of a second most significant bit (MSB) of the lower M-bit signals and the first counter clock signal to a clock terminal of a D flip-flop which outputs the MSB of the lower M-bit signals.

9. The counter circuit of claim 1, wherein the upper (N−M)-bit signals are toggling with a falling edge of the first counter clock signal, and the lower M-bit signals are toggling with a falling edge of the second counter clock signal.

10. An analog-to-digital converter (ADC) comprising:
a comparator which is configured to compare an analog signal and a reference signal to generate a first comparison signal, wherein the analog signal represents a physical quantity; and
a counter circuit comprising:
a first counter which is configured to count a first counter clock signal which toggles with a first frequency to generate upper (N−M)-bit signals of N-bit counter output signals, in response to a first counting enable signal based on a first comparison signal during a coarse counting interval; and
a second counter which is configured to count a second counter clock signal which toggles with a second frequency which is higher than the first frequency to generate lower M-bit signals of the N-bit counter output signals, in response to a second counting enable signal based on the first comparison signal and a second comparison signal during a fine counting interval which follows the coarse counting interval,
wherein N and M are natural numbers, N is greater than M, and M is greater than or equal to 3,
wherein the counter circuit is configured to generate a digital signal which corresponds to the analog signal based on a first input clock signal and a second input clock signal,
wherein the counter circuit further comprises a counter control logic which is configured to generate the first counting enable signal, the first counter clock signal, the second counting enable signal, and the second counter clock signal based on the first comparison signal, the second comparison signal, the first input clock signal having the first frequency, and the second input clock signal having the second frequency, and
wherein the first comparison signal is inverted and delayed in comparison to the second comparison signal.

11. The ADC of claim 10, wherein the first counter comprises:
a switching unit which is configured to select one of a most significant bit (MSB) signal of the lower M-bit signals and the first counter clock signal in response to the first counting enable signal; and
a first counting unit which is connected to the switching unit,
wherein the first counting unit is configured to be disconnected from the second counter during the coarse counting interval, be connected to the second counter during the fine counting interval, and generate the upper (N−M)-bit signals, and
wherein the counter performs a counting operation at least twice per cycle period of the first counter clock signal and the second counter clock signal, and the second frequency is $2^{(M-1)}$ times or $2^{(M-2)}$ times higher than the first frequency.

12. An image sensor comprising:
a sensing unit which is configured to sense a physical quantity to generate an analog signal which corresponds with the physical quantity;
an analog-to-digital converter (ADC) which is configured to compare the analog signal with a reference signal and generate a digital signal which corresponds with the analog signal using at least one counter circuit including the counter circuit of claim 1; and
a control unit which is configured to control the sensing unit and the ADC, and wherein the sensing unit comprises:
a pixel array which is configured to sense an incident light and generate the analog signal, and the pixel array is further configured to sequentially output a first analog signal and a second analog signal for correlated double sampling,
wherein the first analog signal represents a reset component, and the second analog signal represents an image signal component.

13. The image sensor of claim 12, wherein the counter circuit is configured to invert the N-bit counter output signal in response to at least one inversion control signal after the counter circuit completes a counting operation on the first analog signal and before the counter circuit starts a counting operation on the second analog signal.

14. The image sensor of claim 12, wherein the counter circuit is configured to perform a coarse counting which provides the upper (N−M)-bit signals and a fine counting which provides the lower M-bit signals based on the first comparison signal and the second comparison signal in response to the pixel array sequentially outputting the first analog signal and the second analog signal,
wherein the first comparison signal is obtained by comparing the first analog signal, and the second comparison signal is obtained by at least delaying the first comparison signal.

15. The image sensor of claim 12, wherein the second frequency is $2^{(M-1)}$ times or $2^{(M-2)}$ times higher than the first frequency.

16. A method of correlated double sampling, the method comprising:
counting a first analog signal which represents a reset component in a first counting operation;
counting a second analog signal which represents a signal component in a second counting operation; and
generating a digital signal which corresponds to a difference between the first analog signal and the second analog signal based on a plurality of results from the first counting operation and the second counting operation, wherein each of the first counting operation and the second counting operation comprises:

counting a first counter clock signal which toggles with a first frequency to generate upper (N−M)-bit signals of N-bit counter output signals during a coarse counting interval based on a first comparison signal, the N-bit counter output signals correspond to each of the first analog signal and the second analog signal; and counting a second counter clock signal which toggles with a second frequency which is higher than the first frequency to generate lower M-bit signals of the N-bit counter output signals during a fine counting interval based on the first comparison signal and a second comparison signal, the fine counting interval follows the first coarse counting interval, wherein N and M are natural numbers, N is greater than M, and M is greater than or equal to 3.

17. The method of claim 16, further comprising:

inverting the N-bit counter output signals in response to at least one inversion control signal after the counter circuit completes a counting operation on the first analog signal and before the counter circuit initializes a counting operation on the second analog signal, wherein the second frequency is $2^{(M-1)}$ times or $2^{(M-2)}$ times higher than the first frequency.

18. A method of correlated double sampling for outputting a counter output signal, the method comprising:

inputting a first counting enable signal during a course counting interval;

inputting a second counting enable signal during a fine counting interval;

generating a plurality of upper bits of the counter output signal by counting a first counter clock signal which toggles with a first frequency in response to the first counting enable signal; and generating a plurality of lower bits of the counter output signal by counting a second counter clock signal which toggles with a second frequency in response to the second counting enable signal, wherein the fine counting interval occurs after the course counting interval, and wherein the first counting enable signal toggles with a different frequency than the second counting enable signal.

19. The method of claim 18, wherein the second counting enable signal toggles with a higher frequency then the first counting enable signal, and wherein the second frequency is $2^{(M-1)}$ times higher or $2^{(M-2)}$ times higher than the first frequency.

20. The method of claim 18, wherein the first counting enable signal is based on a first comparison signal, and the second counting enable signal is based on the first comparison signal and a second comparison signal.

* * * * *